US007999303B2

(12) United States Patent
Kikuchi et al.

(10) Patent No.: US 7,999,303 B2
(45) Date of Patent: Aug. 16, 2011

(54) NAND-TYPE NONVOLATILE SEMICONDUCTOR MEMORY DEVICE

(75) Inventors: Shoko Kikuchi, Kanagawa (JP); Yasushi Nakasaki, Kanagawa (JP); Koichi Muraoka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 342 days.

(21) Appl. No.: 12/353,586

(22) Filed: Jan. 14, 2009

(65) Prior Publication Data

US 2009/0242958 A1 Oct. 1, 2009

(30) Foreign Application Priority Data

Mar. 28, 2008 (JP) ................................ 2008-087112

(51) Int. Cl.
*H01L 29/788* (2006.01)

(52) U.S. Cl. ............ 257/316; 257/E21.69; 257/E27.103

(58) Field of Classification Search .......... 257/314–316, 257/326, 390, E21.69, E27.103, E29.3; 365/185.17, 365/185.33

See application file for complete search history.

(56) References Cited

U.S. PATENT DOCUMENTS

| | | | | |
|---|---|---|---|---|
| 6,809,371 | B2 | 10/2004 | Sugiyama | |
| 6,858,906 | B2 | 2/2005 | Lee et al. | |
| 7,129,136 | B2 | 10/2006 | Sugiyama | |
| 7,247,538 | B2 | 7/2007 | Lee et al. | |
| 7,253,467 | B2 | 8/2007 | Lee et al. | |
| 7,889,557 | B2 * | 2/2011 | Park et al. | 365/185.17 |
| 7,910,430 | B2 * | 3/2011 | Om et al. | 438/257 |
| 2004/0251489 | A1 | 12/2004 | Jeon et al. | |
| 2005/0122775 | A1 | 6/2005 | Koyanagi et al. | |
| 2005/0128816 | A1 | 6/2005 | Lee et al. | |
| 2006/0180851 | A1 | 8/2006 | Lee et al. | |
| 2007/0063265 | A1 | 3/2007 | Lee et al. | |
| 2007/0296026 | A1 | 12/2007 | Jeon et al. | |
| 2008/0001212 | A1 | 1/2008 | Lee et al. | |
| 2008/0116507 | A1 | 5/2008 | Ino et al. | |

FOREIGN PATENT DOCUMENTS

EP 1 737 033 A1 12/2006

(Continued)

OTHER PUBLICATIONS

Y. Saito, et al., "Characterization of non-volatile memory using a thin aluminosilicate film as a charge trapping layer", The Japan Society of Applied Physics, No. 2, 2006, 1 page.

(Continued)

*Primary Examiner* — David Vu

(74) *Attorney, Agent, or Firm* — Oblon, Spivak, McClelland, Maier & Neustadt, L.L.P.

(57) ABSTRACT

The present invention provides a high-performance MONOS-type NAND-type nonvolatile semiconductor memory device using an aluminum oxide film as a part of gate insulating film in a select transistor and as a block insulating film in a memory transistor. The NAND-type nonvolatile semiconductor memory device has, on a semiconductor substrate, a plurality of memory cell transistors connected to each other in series and a select transistor. The memory cell transistor includes a first insulating film on the semiconductor substrate, a charge trapping layer, a second insulating film made of aluminum oxide,
a first control gate electrode, and a first source/drain region. The select transistor includes a third insulating film on the semiconductor substrate, a fourth insulating film made of an aluminum oxide containing at least one of a tetravalent cationic element, a pentavalent cationic element, and N (nitrogen), a second control gate electrode, and a second source/drain region.

24 Claims, 17 Drawing Sheets

FOREIGN PATENT DOCUMENTS

| | | |
|---|---|---|
| JP | 2003-68897 | 3/2003 |
| JP | 2003-282746 | 10/2003 |
| JP | 2004-55969 | 2/2004 |
| JP | 2004-158810 | 6/2004 |
| JP | 2005-5715 | 1/2005 |
| JP | 2005-328029 | 11/2005 |
| JP | 2008-130743 | 6/2008 |
| JP | 2009-81203 | 4/2009 |
| JP | 2009-239216 | 10/2009 |

OTHER PUBLICATIONS

Jang-Sik Lee, et al., "Data Retention Characteristics of MONOS Devices with High-*k* Dielectrics and High-work Function Metal-gates for Multi-gigabit Flash Memory" Extended Abstracts of the 2005 International Conference on Solid State Devices and Materials, Kobe, 2005, pp. 200-201.

T. Nakagawa, et al., "Charge Trapping Characteristics of Two-layered AI203/SiO2 Stack for Non-volatile Memory Device", Abstract No. G1.3, Materials Research Society, 2006, 2 pages.

Katsuyuki Matsunaga, et al, "First-principles study of defect energetics in titanium-doped alumina", Physical Review B, vol. 68, 2003, 8 pages.

Katsuyuki Matsunaga, et al., "First-Principles calculations of intrinsic defects in $Al_2O_3$", Physical Review B, vol. 68, 2003, 9 pages.

L. Manchanda, et al., "Gate Quality Doped High K Films for CMOS Beyond 100 nm: 3—10nm $Al_2O_3$ with Low Leakage and Low Interface States", IEEE, International Electron Device Meeting (IEDM), 1998, 4 pages.

* cited by examiner 100
22
SL
BL1
24
STS1
MT11
MT12
MT1n
STD1
108b
106b
102b
108a
106a
104
102a
n+
p−
110a
110b
110c
110d
110e

NAND-TYPE NONVOLATILE SEMICONDUCTOR MEMORY DEVICE

CROSS-REFERENCE TO RELATED APPLICATION

This application is based upon and claims the benefit of priority from Japanese Patent Applications No. 2008-087112, filed on Mar. 28, 2008, the entire contents of which are incorporated herein by reference.

FIELD OF THE INVENTION

The present invention relates to a NAND-type nonvolatile semiconductor memory device having a MONOS type memory cell.

BACKGROUND OF THE INVENTION

In a flash memory, as the memory capacity increases, the memory cell size is becoming smaller. In a very small cell, attention is therefore being paid to a MONOS (Metal-Oxide-Nitride-Oxide-Semiconductor) type memory obtained by changing a charge trapping layer from a floating gate type to an insulating film having a charge trapping ability.

The MONOS-type memory has a structure in which a tunnel insulating film for passing charges by controlling bias voltage, a charge trapping layer, and a block insulating film for blocking current between the charge trapping layer and a control gate electrode are sequentially stacked. Since this type of memory has structural simplification and therefore realizes shrinkage, the memory is being examined for further shrinkage as a future-generation memory.

At present, to realize a very small cell using a MONOS-type memory, an attempt to introduce a material having a higher dielectric constant (high-k material) in place of a silicon oxide film conventionally used as the block insulating film is being examined. In particular, an aluminum oxide film has a dielectric constant higher than that of a silicon oxide film and has excellent retention characteristics of trapped charge. Therefore, practical use of the aluminum oxide film as a future-generation block insulating film is being examined (see, for example, J-S. Lee, et al., SSDM (2005) 200).

SUMMARY OF THE INVENTION

A NAND-type nonvolatile semiconductor memory device as an embodiment of the present invention includes, a semiconductor substrate, a plurality of memory cell transistors connected to each other in series formed on the semiconductor substrate, and a select transistor provided at an end of the plurality of memory cell transistors formed on the semiconductor substrate. The memory cell transistor has: a first insulating film on the semiconductor substrate; a charge trapping layer on the first insulating film; a second insulating film made of aluminum oxide on the charge trapping layer; a first control gate electrode on the second insulating film; and a first source/drain region formed in the semiconductor substrate on both sides of the first control gate electrode. The select transistor includes: a third insulating film on the semiconductor substrate; a fourth insulating film on the third insulating film made of an aluminum oxide containing at least one of a tetravalent cationic element, a pentavalent cationic element, and N (nitrogen); a second control gate electrode on the fourth insulating film; and a second source/drain region formed in the semiconductor substrate on both sides of the second control gate electrode.

A NAND-type nonvolatile semiconductor memory device as an embodiment of the present invention includes, a semiconductor substrate, a plurality of memory cell transistors connected to each other in series formed on the semiconductor substrate, and a select transistor provided at each end of the plurality of memory cell transistors formed on the semiconductor substrate. The memory cell transistor has: a first insulating film on the semiconductor substrate; a second insulating film made of aluminum oxide on the first insulating film; a first control gate electrode on the second insulating film; and a first source/drain region formed in the semiconductor substrate on both sides of the first control gate electrode. The select transistor includes: a third insulating film on the semiconductor substrate; a fourth insulating film on the third insulating film, the fourth insulating film being made of an aluminum oxide containing at least one of a tetravalent cationic element, a pentavalent cationic element, and N (nitrogen); a second control gate electrode on the fourth insulating film, and a second source/drain region formed in the semiconductor substrate on both sides of the second control gate electrode.

DETAILED DESCRIPTION OF THE EMBODIMENTS

Figure 1:
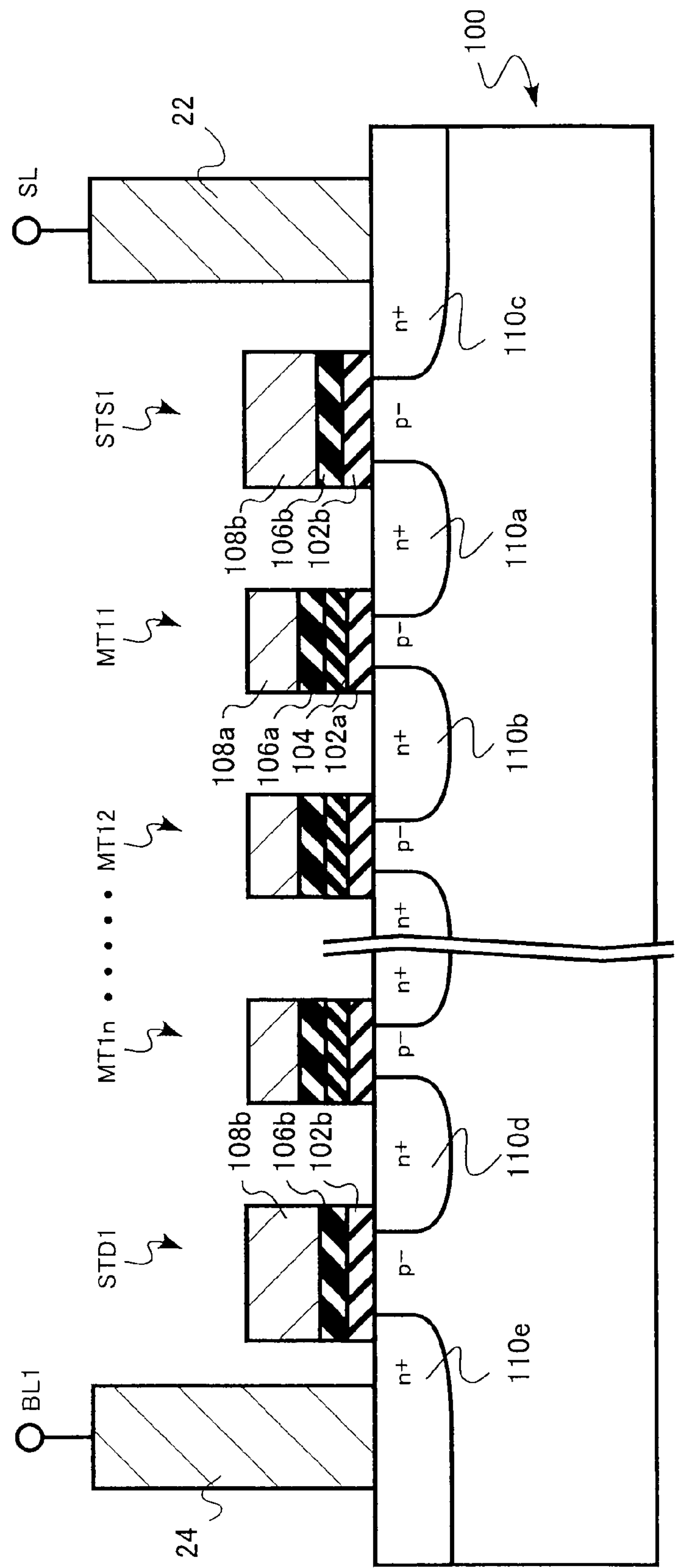
FIG. 1 is a cross section of a NAND-type nonvolatile semiconductor memory device of a first embodiment.

An NAND-type nonvolatile semiconductor memory device has a memory cell transistor region and a select transistor region in which a select transistor for selecting a desired memory cell transistor is fabricated. To reduce the number of manufacturing processes and the cost, a manufacturing method of using same structures for the memory cell transistor and the select transistor as much as possible is being employed. The interval between memory cell transistors connected in series and the select transistor is determined in consideration of the degree of integration (shrinkage) and electric characteristics such as writing error. Usually, one or a few gate dummy patterns each having no function as an active device and having the same interval as the control gate electrode part in a memory cell transistor is/are interposed.

In the case of using an aluminum oxide film (hereinbelow, also described as an $Al_2O_3$ film as a representative of the aluminum oxide film) as a block insulating film in an MONOS-type memory, the existence of the aluminum oxide film is not always necessary for the select transistor region from the viewpoint of the device operation of the select transistor function. However, addition of a selective etching process, degradation in electric characteristics due to dispersion of device size according to misalignment, degradation in the electric characteristics of a gate $SiO_2$ under the aluminum oxide film caused by etching damage in dry etching process of the aluminum oxide film due to the difficulty of high-selectivity dry etching of $Al_2O_3$ against $SiO_2$ and Si, as the largest concern, and the like have to be avoided. Consequently, the select transistor region has an electrode/$Al_2O_3$/SiN/$SiO_2$ structure (MANOS) which is the same as that of the memory transistor region, or an electrode/$Al_2O_3$/$SiO_2$ structure (MAOS) obtained by removing SiN is employed (hereinbelow, also described as an SiN film as a representative of the silicon nitride ($SiN_x$ x is around 4/3) film).

In the former case, a charge trapping by SiN as the charge trapping layer inevitably occurs. Also in the latter case, a charge trapping caused by the $Al_2O_3$/$SiO_2$ interface occurs. In both of the cases, the threshold voltage of the transistors shifts largely, and a problem arises that it is difficult to control the threshold voltage. Therefore, also in the case of using an $Al_2O_3$ film as the blocking insulating film, it is requested to reduce the threshold voltage shift due to the charge trapping in the select transistor.

Prior to explanation of the embodiments of the present invention, the basic experimental and theoretical principles of the present invention will be described. The inventors of the present invention have found out that, in the case of using an $Al_2O_3$/$SiO_2$ stack film as the gate insulating film of the select transistor in the NAND-type nonvolatile semiconductor memory device, by introducing a tetravalent cationic element, a pentavalent cationic element, or N into $Al_2O_3$, the amount of charge trapping centers is reduced. At first, the experimental fact will be described below.

As a basic experiment for effectiveness of reduction of the charge trapping by adding another element to an $Al_2O_3$/$SiO_2$ stack film, first, the influence of Si as a tetravalent cationic element was examined. To check the trapped charge density of an existing MAOS (Mo electrode/$Al_2O_3$/$SiO_2$/Si) capacitor, the relation between the amount of trapped charge and the film thickness of samples in which the thickness of an $SiO_2$ film is fixed while only the thickness of an $Al_2O_3$ film is changed was investigated. The influence of heat treatment at 600° C. and 1000° C. was also evaluated for considering an interfacial reaction at the $Al_2O_3$/$SiO_2$ interface.

Figure 3:
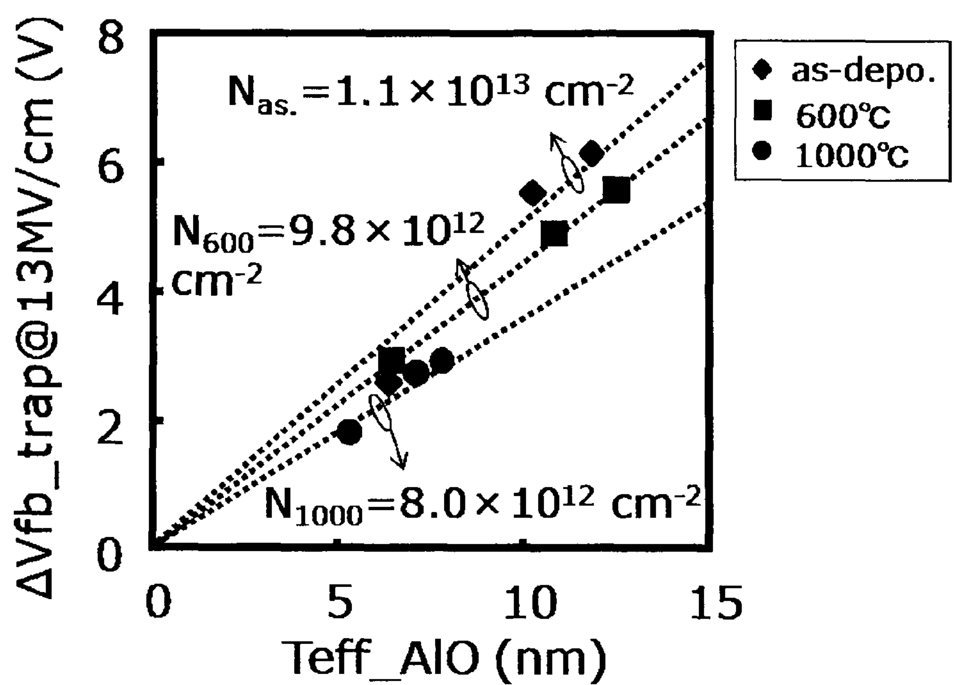
FIG. 3 is a graph showing the relation between $SiO_2$-equivalent thickness (equivalent oxide thickness: EOT) of an $Al_2O_3$ oxide film and change in $V_{fb}$ after stress is applied.

FIG. 3 is a graph showing the relation between $SiO_2$-equivalent thickness ($T_{eff\_AlO}$) of an $Al_2O_3$ silicon oxide film and a change in a flat-band voltage $V_{fb}$ ($\Delta V_{fb}$) after 13 MV/cm was applied as an electric stress. Both $T_{eff\_AlO}$ and $\Delta V_{fb}$ show a linear relationship whose Y-intercept is zero in both cases before and after annealing. From the graph, it is understood that it is highly possible for the the charge trap of $Al_2O_3$/$SiO_2$/Si to exist at the interface of $Al_2O_3$/$SiO_2$. It is also understood that the higher the heat treatment temperature is, the lower the trapped charge density (N) is. Considering the contribution of Si to the $Al_2O_3$/$SiO_2$ interfacial reaction during the annealing process as one reason for the reduction, the influence on the trap charge was investigated in samples added with the Si into the $Al_2O_3$ layer in advance.

Figure 4:
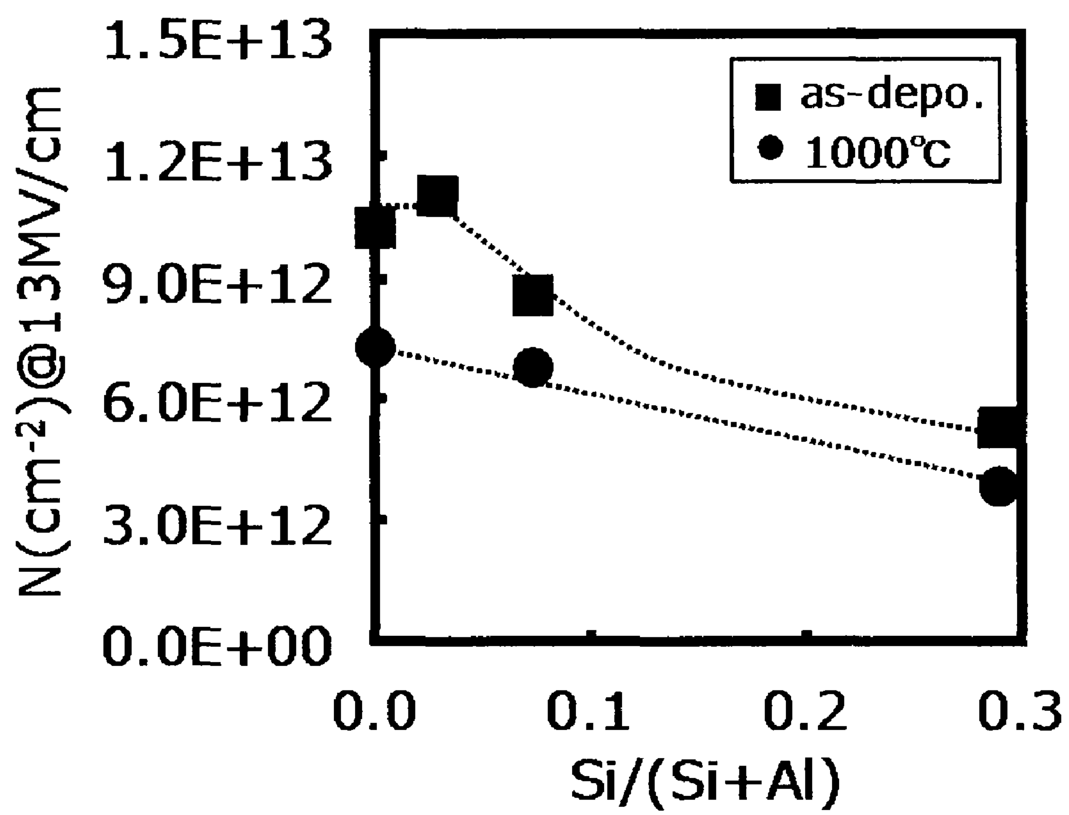
FIG. 4 is a graph showing the relation between concentration of Si (described as cationic atomic fraction in Si/(Si+Al)) in $Al_2O_3$ and trapped charge density before and after annealing (heat treatment).

FIG. 4 is a graph showing the relation between Si concentration (described as cationic fraction in Si/(Si+Al)) in $Al_2O_3$ and trapped charge density (N) before and after annealing (heat treatment) at 1000° C. According to the line "as-depo. (depo. is abbreviation of deposition)" showing the relation before the heat treatment, it is understood that when Si satisfying Si/(Si+Al)=0.03 or more is added into $Al_2O_3$, the trapped charge density is largely reduced. From the result, it is understood that addition of Si into $Al_2O_3$ in advance reduces the trapped charge density sufficiently and effectively. By the heat treatment of 1000° C., the trapped charge density was further decreased. The reason is considered that the contribution of Si to reduction of trapped charge density increases because of some sort of reaction occurred during the high-temperature heat treatment.

From the above, it is understood that, by diffusing Si into $Al_2O_3$ by heat treatment or by adding Si into $Al_2O_3$ in advance, the trapped charge density in the MAOS structure largely decreases.

The structure of a defect contributed to decrease in the trapped charge density cannot be identified only from the above experimental fact. To reveal the contribution clearly, the inventors of the present invention executed first-principles calculations within the theoretical framework of the SP-GGA-DFT method (Spin-Polarized Generalized Gradient Approximation Density Functional Theory) by using supercells based on 2×2×2 cells (including total 16 $Al_2O_3$=80 atoms) of α-$Al_2O_3$ unit cells (including 2$Al_2O_3$=10 atoms) and 2×2×2 cells (including 24 $SiO_2$=72 atoms) of α-$SiO_2$ unit cells (including 3 $SiO_2$=9 atoms).

In the calculation of the $Al_2O_3$ system, a defect pair (complex) of a substitutional ($M_{Al}$) or interstitial ($M_i$) type defect of M (M=Si, Hf) and one of the following defects such as Al vacancy ($V_{Al}$), oxygen vacancy ($V_O$), interstitial oxygen ($O_i$), substituted nitrogen ($N_O$), and interstitial nitrogen ($N_i$) was introduced, and each of the defect structures and defect levels in the case where the defect capture/release positive/negative charges were calculated. In the calculation of the $SiO_2$ system, a defect pair (complex) of a substitutional ($M_{Si}$) or interstitial ($M_i$) type defect of M (M=Al, Ge, Hf, P, or As) and one of the following defects such as Si vacancy ($V_{Si}$), oxygen vacancy ($V_O$), interstitial oxygen ($O_i$), substituted nitrogen ($N_O$), and interstitial nitrogen ($N_i$) was introduced. In the case where the charge state of a supercell is changed (not equal to neutral), an excessive dipolar energy gain accompanying the supercell method was corrected according to the Makov-Payne-Kantorovich method.

Figure 5:
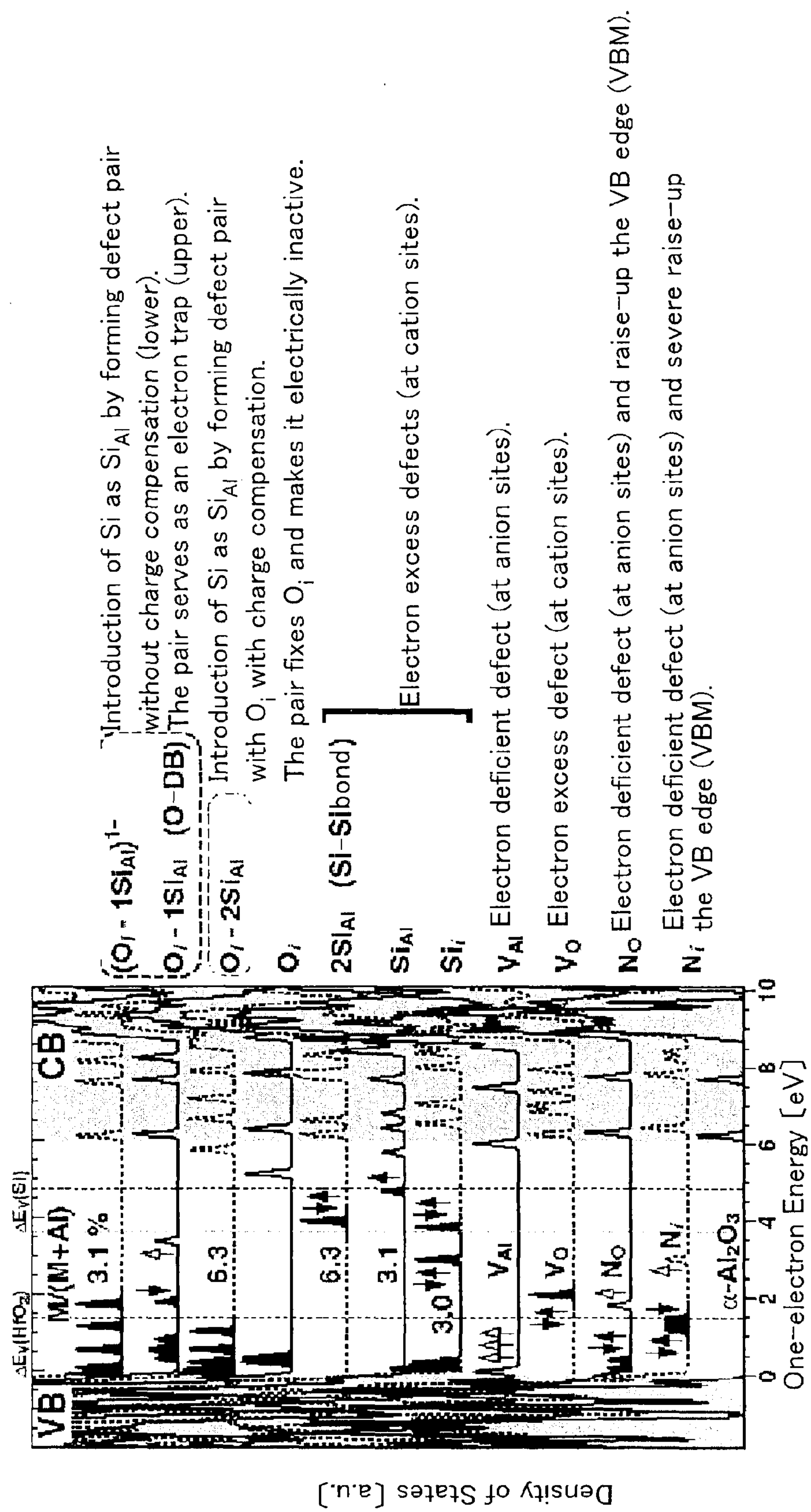
FIG. 5 and FIG. 6 are diagrams showing Kohn-Sham levels of defects in $Al_2O_3$ in various charge states.
Figure 6A:
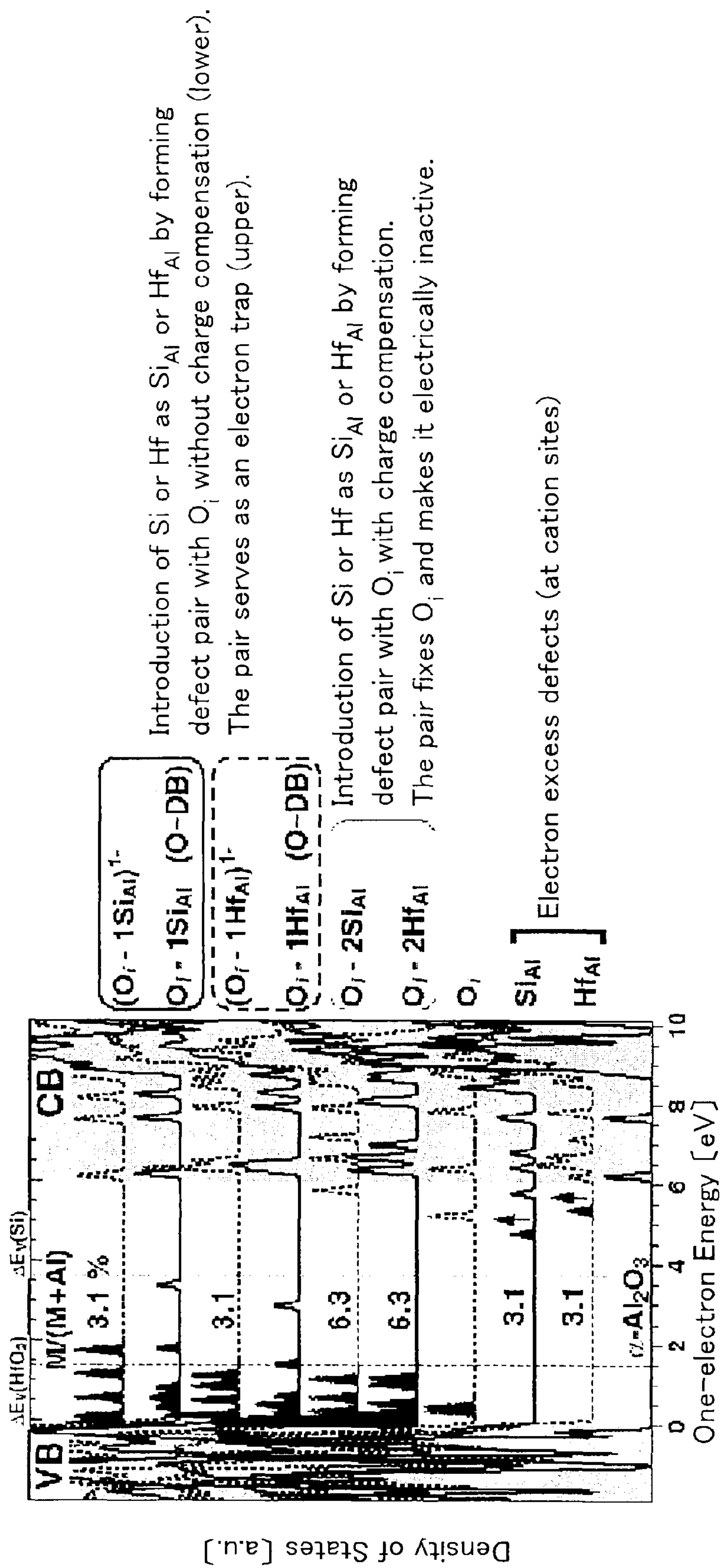

FIGS. 5 and 6A are diagrams, in which the abscissa axis shows one-electron energy which corresponds to Fermi energy and the vertical axis shows density of states, show the Kohn-Sham levels (one-electron energy levels) of the above mentioned defects in $Al_2O_3$ in various charge states. VB denotes a valence band of $Al_2O_3$, CB denotes a conduction band of $Al_2O_3$, $\Delta E_v$ (Si) or $\Delta E_v$ ($HfO_2$) denotes an valence band offset between the valence band maximum of $Al_2O_3$ and the valence band maximum of Si or $HfO_2$, respectively, solid arrows appearing in the band gap denote electron occupied levels, and hollow arrows denote unoccupied levels.

FIG. 5 one-electron energy levels in the case where Si is introduced into $Al_2O_3$. As is usual in oxides, the vicinity of the valence band maximum is consisted of the O 2 p non-bonding orbital, and is not limited to $Al_2O_3$ and $SiO_2$ examined here. First, in considering the origin of traps in an $Al_2O_3/SiO_2$ film, the defect level where electrons are trapped and the trapped electrons are stabilized (not detrapped) are formed as is shown in experiments in FIGS. 3 and 4. Consequently, it is expected that interstitial oxygen ($O_i$) and Al vacancy ($V_{Al}$) are to be the trap origin.

Figure 7:
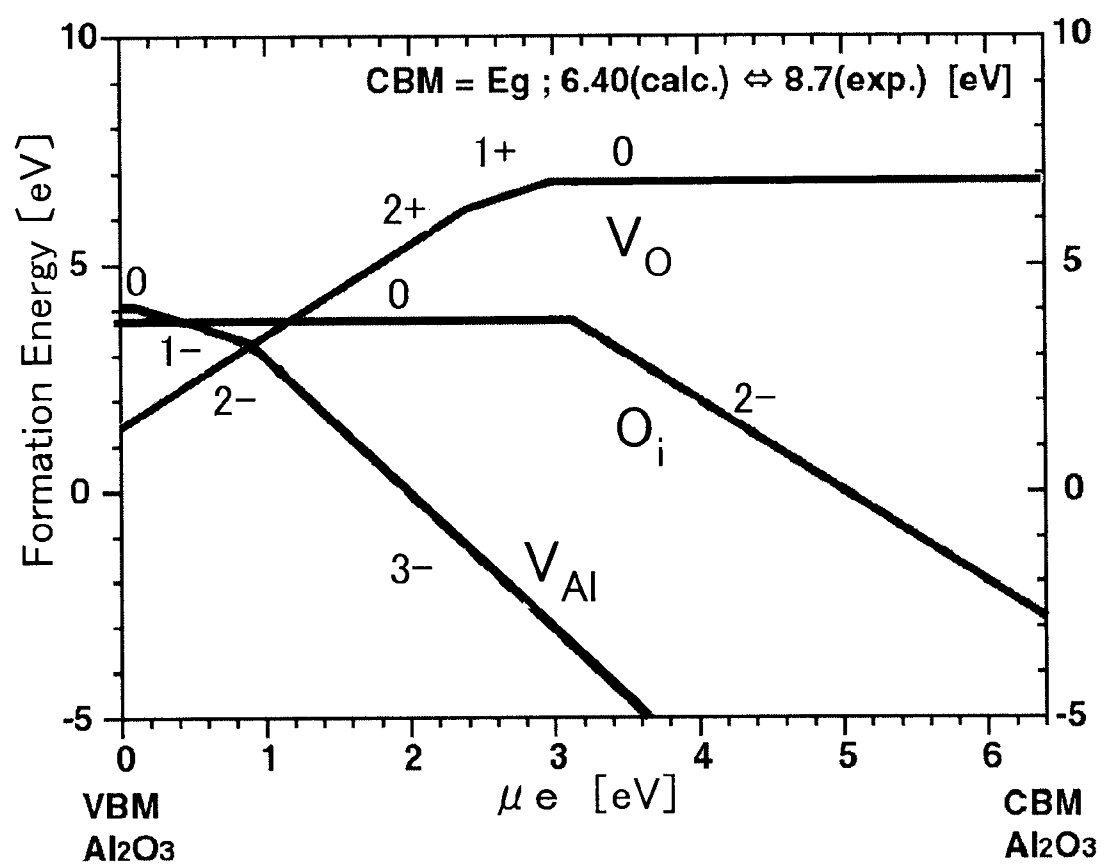
FIG. 7 is a diagram showing charge trapping levels, electron affinities, and hole affinity of $O_i$, $V_{Al}$, and $V_O$ as a function of a Fermi level in terms of a change in its formation energy.

FIG. 7 is a diagram showing charge trapping levels, electron affinities, and hole affinity of $O_i$, $V_{Al}$, and $V_O$ as a function of a Fermi level in terms of a change in its formation energy by first-principles calculations. Whether charges can be received/released or not can be easily identified at a glance only from the Kohn-Sham levels illustrated in FIG. 5 or 6A, however, accurate charge capturing/releasing energy levels cannot be known. In an ionic material particularly such as $Al_2O_3$, lattice relaxation accompanying large energy gain occurs as the additional charges are captured/released, and an accurate defect level cannot be determined without considering it.

The inventors of the present invention have determined accurate defect levels by comparing all of total energies before and after capturing/releasing additional charges with the structural relaxation. In FIG. 7, the abscissa axis denotes an one-electron energy which corresponds to Fermi energy, and the vertical axis denotes a formation energy of defect. A positive value on the vertical axis indicates endothermic reaction, and a negative value indicates exothermic reaction. For each of the defects, a horizontal line and a straight line bent at a certain point from each horizontal line are shown. The horizontal portion of each line indicates formation energy in a neutral charge state. Since the formation energy of the neutral charge states does not depend on the Fermi level, it is parallel to the abscissa axis.

On the other hand, total energy in the charged state largely depends on the Fermi level, behaves so as to have a bending point with respect to the values in the abscissa axis, and is expressed as a line graph. In the charged states of defects, the difference between the horizontal portion and the ever-decreasing portion of each line is electron affinity, and the difference between the horizontal portion and the ever-increasing portion of each line corresponds to hole affinity. In the diagram, the difference between the value of the abscissa axis (Fermi level) of the bending point between charged states denoted as, for example, "0" and "−2" and the conduction band minimum (CBM: M denotes minimum indicative of the lower edge) corresponds to the doubly-acceptor level.

In the diagram, neutral $O_i$ forms an electron unoccupied level by an unoccupied orbital of O 2 p in a band gap. The unoccupied level is shallow in the neutral state (near the conduction band minimum). When electrons are captured into the level, large lattice relaxation occurs and $O_i$ is largely stabilized by the negative-U effect. Consequently, it is understood that when electrons are captured and $O_i$ becomes $O_i^{2-}$, the electron occupied level becomes deeper in the band gap, and $O_i$ is largely stabilized. A neutral $V_{Al}$ can also accept three electrons at maximum ($V_{Al}^{3-}$) into the unoccupied orbital of O 2 p of neighboring three O atoms, and the level is within a deep range of 2 eV from VBM. It is consequently understood that electrons are trapped but not easily detrapped.

In the interface of $Al_2O_3$ and $SiO_2$, a defect may be formed in $SiO_2$ region, and it is also expected that mutual substitution between tetravalent Si and trivalent Al easily occurs. Actually, it is understood by the theoretical calculations of the inventors of the present invention that, also in the case where a Si site in $SiO_2$ is substituted with Al ($Al_{Si}$), an electron unoccupied level at the valence band maximum of $SiO_2$ is formed by the unoccupied orbital of O 2 p of one of the O atoms adjacent to $Al_{Si}$, and stabilization is realized by trapping an electron.

From experimental results, the followings are revealed. The charge traps (electron traps) are highly possible to exist in the interface of $Al_2O_3$ and $SiO_2$, and the decrease in charge traps by high-temperature annealing seems to be due to the influence of Si because of mixing of $Al_2O_3$ and $SiO_2$ around the interface. The contribution of Si will be clarified considering together with a result of the first-principles calculations.

In the case of Si addition into $Al_2O_3$, where a small amount of an Al site is substituted with Si ($Si_{Al}$) and oxygen is properly supplied to produce interstitial oxygen ($O_i$), it is possible for the proportion of $O_i$ and Si ($Si_{Al}$) substituting the Al site to be set to 1:1. This sort of defect pair (complex) is described as $O_i$−1$M_{Al}$ (M=tetravalent cation such as Si and Hf) in FIGS. 5, 6A, and 9. Only by forming the pair with the proportion, an unoccupied level corresponds to just one electron per the defect pair remains.

However, when an electron is trapped into the defect pair, the unoccupied level in a band gap disappears, and is stabilized to a level consist of a non-bonding electrons of oxygen, and the level appears near the valence band maximum. Further, when the amount of Si is increased, the proportion of $O_i$ and $Si_{Al}$ becomes possible to be 1:2. In this case, by forming this defect pair alone, electron trap levels in the band gap disappear without charge injection from the electrodes. Consequently, it largely contributes to decrease in charge traps in $Al_2O_3/SiO_2$ system.

On the other hand, an $Si_{Al}$ generates an excess electron by the occupied orbital of Si 3 sp in the band gap of $Al_2O_3$. Therefore, when an Al vacancy exists, the excess electron of an $Si_{Al}$ is trapped by an Al vacancy site ($V_{Al}$). And finally, a charge compensation defect pair ($V_{Al}$–3 $Si_{Al}$) is formed and energetically stabilized. Therefore, it was clarified by the theoretical calculation for the first time that, in the case where any of these defects occurs, charge trapping is reduced by adding Si into $Al_2O_3$.

Next, the effect by addition of nitrogen will be described. As shown in FIG. 5, N 2 p electrons of either interstitial nitrogen ($N_i$) or nitrogen substituting an oxygen vacancy ($N_O$) are shallower than O 2 p electrons. Therefore, an electron occupied level is generated just above the valence band maximum in the $Al_2O_3$ band gap. Furthermore, in an $N_O$, an unoccupied level is generated in the higher side of the occupied level. In an $N_i$, to add to the additional levels generated in the $N_O$ case, another occupied level is generated in almost the same depth as the occupied level.

Consequently, when an Al vacancy ($V_{Al}$) exists in $Al_2O_3$, an excess electron of $N_O$ or $N_i$ formed at a shallower side in the band gap moves to $V_{Al}$, a 2 $V_{Al}$–3 $N_O$ defect pair or $V_{Al}$–1 $N_i$ defect pair is formed, and the whole system is stabilized. However, it is understood that, in the 2 $V_{Al}$–3 $N_O$ defect pair, an excess unoccupied level caused by $N_O$ still remains, so that charge compensation with 3 $Si_{Al}$ or the like is necessary for a fully stabilization of gap states.

In the case where interstitial oxygen ($O_i$) exists, considering that an interstitial anion such as $O_i$ diffuses while coordinating to a lattice anion and substituting it, the reaction of $N_O+O_i \rightarrow O_O+N_i$ progresses. Further, when an $N_i$ meats another $N_i$, a very strong N≡N bond formation which corresponds to $N_2$ molecule occurs and is stabilized, and the $N_i$ become inactive electrically. It was clarified by theoretical calculation for the first time that the charge trapping is reduced by adding N into $Al_2O_3$.

Figure 6B:
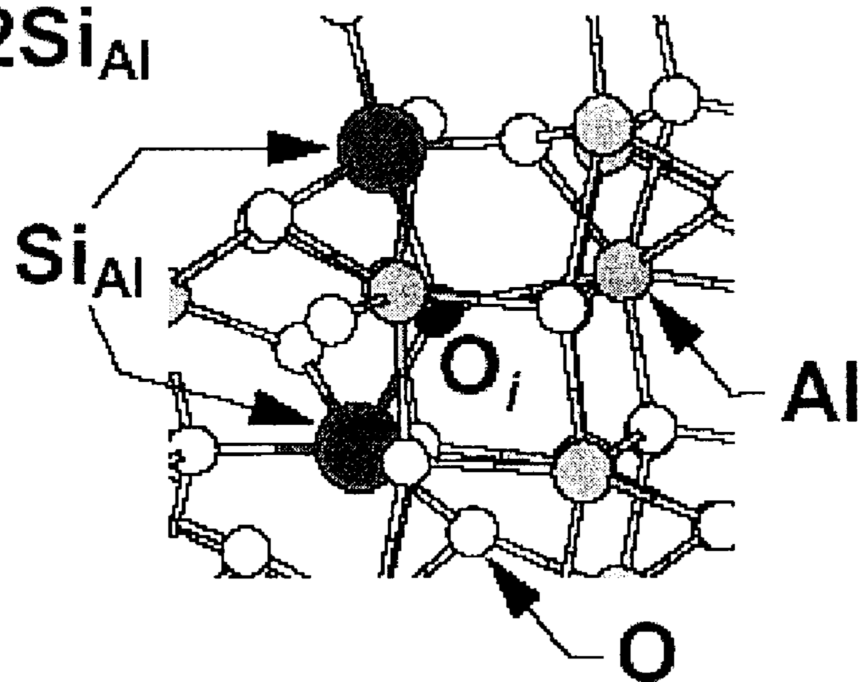
Figure 6B:
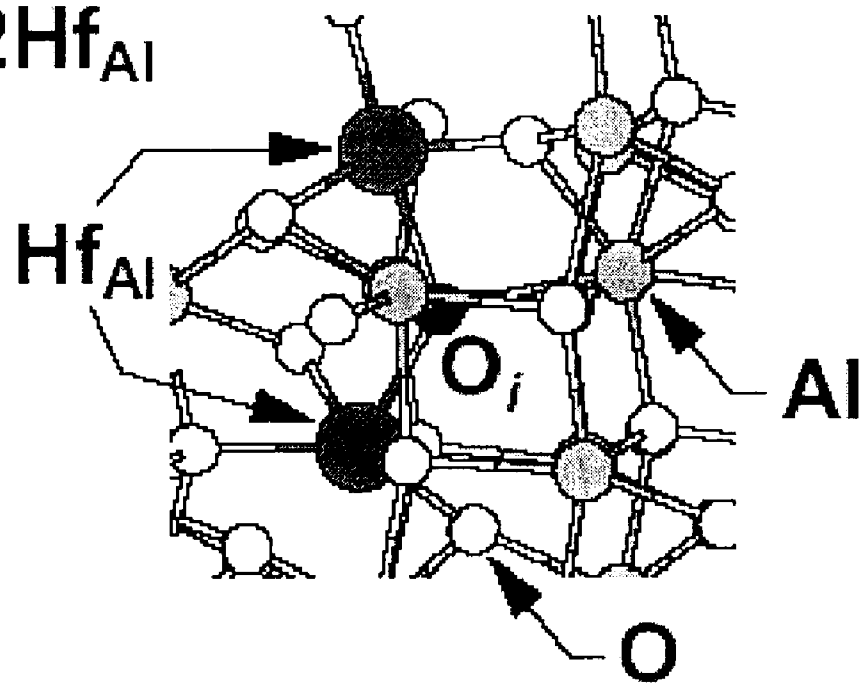

In FIG. 6A, Si and Hf as substitutional elements for Al are compared with each other. It was clarified by the theoretical calculation for the first time that, even in the case of a tetravalent transition metal element Hf having a valence electron of $5d^2 6s^2$ in higher energy level than Si as a typical element, the electronic states of substitutional Hf ($Hf_{Al}$) and related defect pairs are similar to those of Si ($Si_{Al}$) with respect to the structural feature and the defect energy levels. See FIG. 6B.

In a pentavalent element, in each of the case of substituting an Al site in $Al_2O_3$ and the case where the pentavalent cationic atoms as an interstitial atom is generated, at any case, the number of an excess valence electron increases by one with respect to Si and Hf, and two electrons become excessive with respect to Al. In these cases, it was clarified for the first time by theoretical calculation that an $O_i$–1 $M_{Al}$ defect pair and a 2 $V_{Al}$–3 $M_{Al}$ (M=pentavalent cation) defect pair do not have to capture charges from the electrodes but are electronically inactivated.

Figure 8:
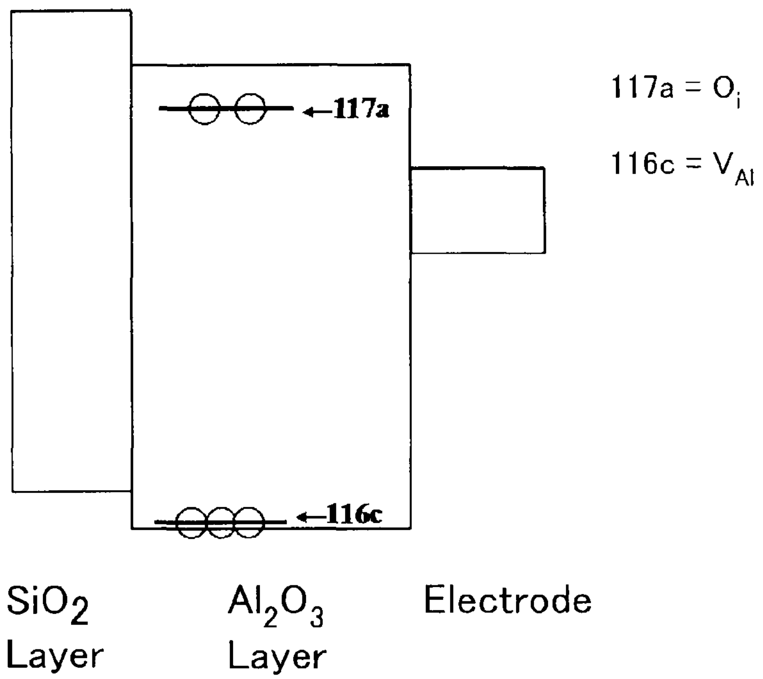
FIG. 8 is a diagram showing typical intrinsic defect levels (one-electron energy levels) in an $Al_2O_3$ band gap of $Al_2O_3/SiO_2$ system.
Figure 9:
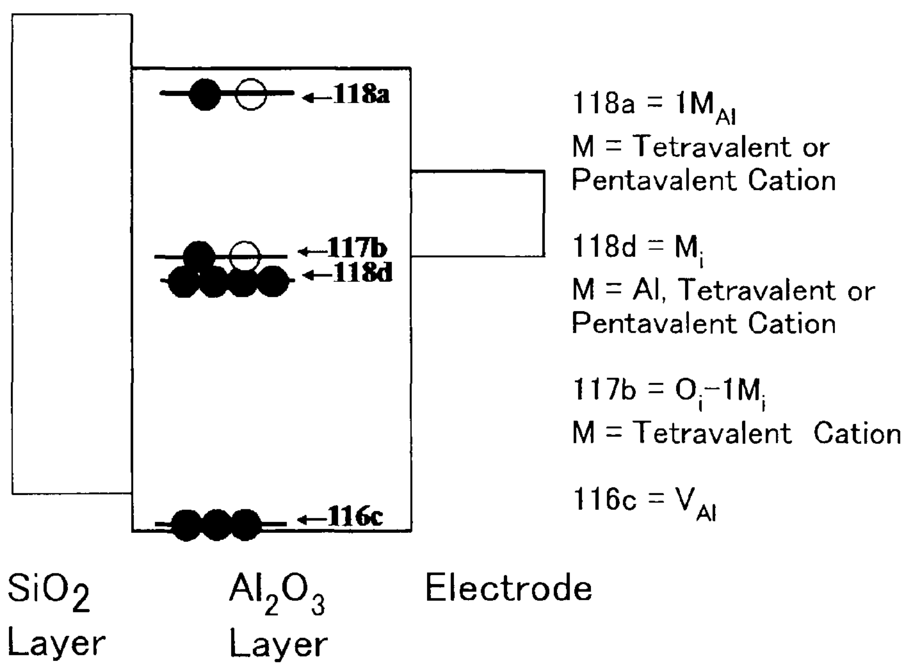
FIG. 9 is a diagram showing changes in a band diagram (one-electron energy levels) according to concentrations when a tetravalent or pentavalent cationic element is added to $Al_2O_3$ in $Al_2O_3/SiO_2$ system, where $M/(Al+M)<0.03$ (M=tetravalent cationic element), or $M/(Al+M)<0.015$ (M=pentavalent cationic element).
Figure 10:
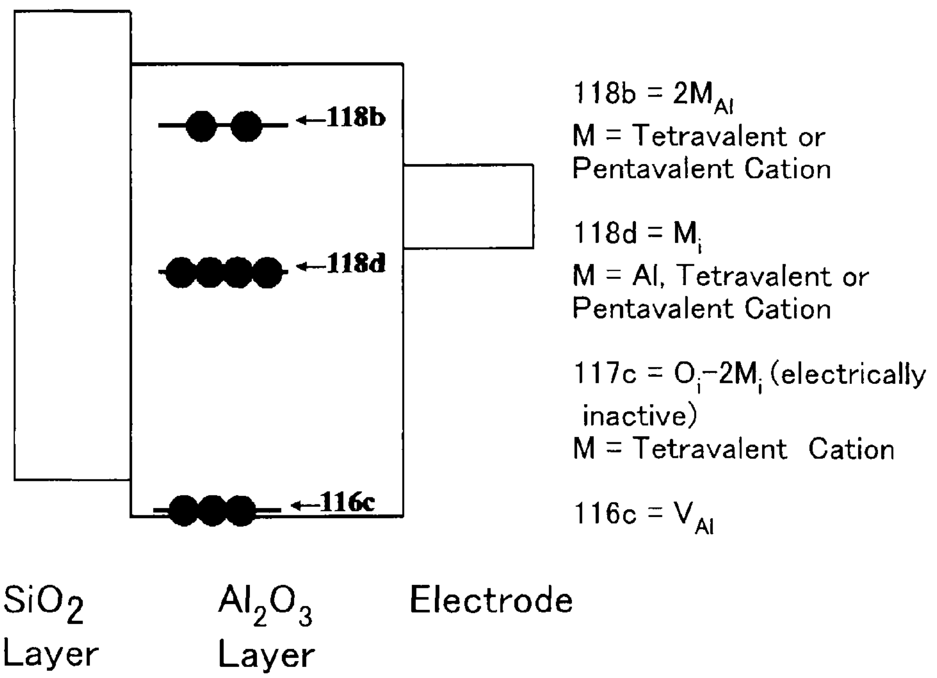
FIG. 10 is a diagram showing changes in a band diagram (one-electron energy levels) according to concentrations when a tetravalent or pentavalent cationic element is added to $Al_2O_3$ in $Al_2O_3/SiO_2$ system, where $0.03 \leqq M/(Al+M) \leqq 0.3$ (M=tetravalent cationic element), or $0.015 \leqq M/(Al+M) \leqq 0.15$ (M=pentavalent cationic element).

FIG. 8 shows typical intrinsic defect levels (one-electron energy levels) in an $Al_2O_3$ band gap of $Al_2O_3/SiO_2$ system as a select gate. FIG. 9 shows changes in the band diagram (one-electron energy levels) according to concentrations when a tetravalent or pentavalent cationic element is added ($M/(M+Al)<0.03$ in terms of an atomic fraction: where M is the tetravalent cationic element and stands for its number density, and Al stands for a number density of Al atom. In the case of the pentavalent cationic element, a similar effect is produced at the concentration which is the half, that is, $M/(Al+M)<0.015$). In the case, not-fully-charge-compensated defect pairs should remain. FIG. 10 shows the changes $0.3 \geqq (M/(M+Al) \geqq 0.03$: where M is the tetravalent cationic element and stands for its number density. In the case of the pentavalent cationic element, a similar effect is produced at the concentration which is the half, that is, $0.15 \geqq M/(Al+M) \geqq 0.015$). In the case, not-fully-charge-compensated defect pairs should not remain. From these results, it is understood that the effect of the addition is displayed more conspicuously at $0.3 \geqq M/(M+Al) \geqq 0.03$ (M= in the case of a tetravalent cation. In the case of the pentavalent cationic element, a similar effect is produced at the concentration which is the half, that is, $0.15 \geqq M/(Al+M) \geqq 0.015$).

Figure 11:
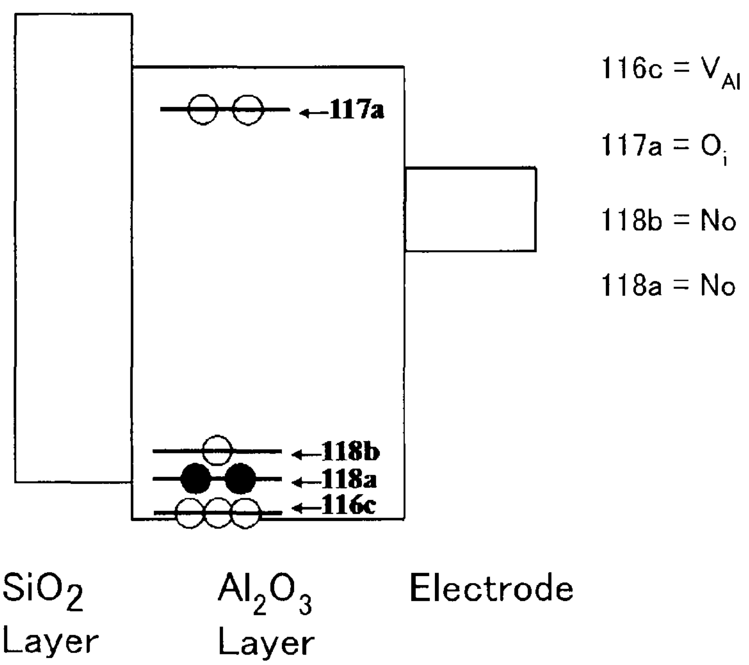
FIG. 11 is a diagram showing a band diagram (one-electron energy levels) in the case of adding N into $Al_2O_3$ in $Al_2O_3/SiO_2$ system, where each defect level does not interact with each other.
Figure 12:
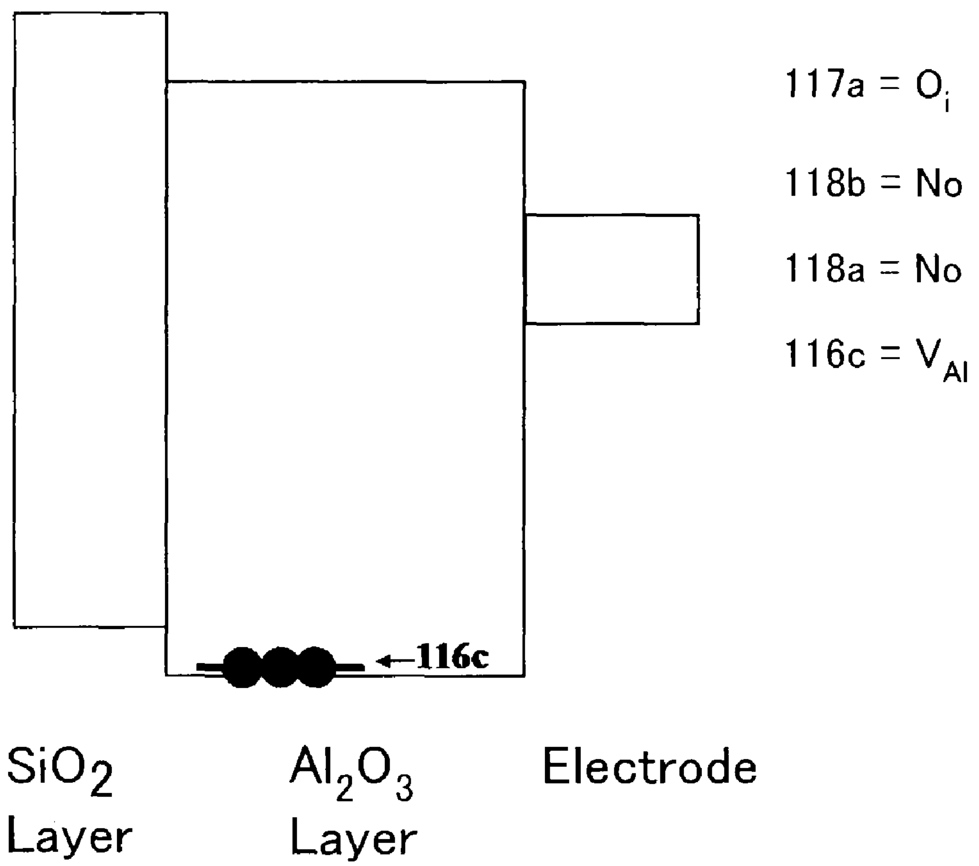
FIG. 12 is a diagram of a band diagram (one-electron energy levels) showing contributions of addition of N, where N-derived level interact with both interstitial oxygen and Al vacancy levels.

FIG. 11 shows band diagram (one-electron energy levels) in the case of adding N into $Al_2O_3$ in $Al_2O_3/SiO_2$ system, where each defect level does not interact with each other. FIG. 12 shows contributions of addition of appropriate concentration of N ($0.02 \leqq N/(O+N) \leqq 0.4$: where N and O stand for number densities of N atom and O atom, respectively) to interstitial oxygen ($O_i$) and Al vacancy ($V_{Al}$) considered as the origin of charge traps in the $Al_2O_3$ band gap. In this case, N-derived level interact with both interstitial oxygen and Al vacancy levels effectively. As described with reference to FIGS. 5 and 6A, the optimum addition concentration is unambiguously determined by the balance between the number of excess or deficient electrons in the $Al_2O_3$ band gap according to interstitial oxygen ($O_i$), Al vacancy ($V_{Al}$), and an oxygen vacancy ($V_O$) as intrinsic defects in $Al_2O_3$, and the number of excess or deficient electrons in the $Al_2O_3$ band gap resulted from the additional elements.

From the above, it was found out that in the case of using an $Al_2O_3/SiO_2$ stack film as a select gate, by introducing a tetravalent cationic element, a pentavalent cationic element, or nitrogen (N) into $Al_2O_3$, the trapped charge density is largely reduced.

Embodiments of the present invention using an aluminum oxide film to which the above-described knowledge found out by the inventors of the present invention will be described with reference to the drawings.

First Embodiment

A NAND-type nonvolatile semiconductor memory device as a first embodiment of the present invention has, on a semiconductor substrate, a plurality of memory cell transistors connected to each other in series, and select transistors provided at each end of the plurality of memory cell transistors connected in series. The memory cell transistor includes a first insulating film on the semiconductor substrate, a charge trapping layer on the first insulating film, a second insulating film made of, as a basic component, aluminum oxide on the charge trapping layer, a first control gate electrode on the second insulating film, and a first source/drain region formed in the semiconductor substrate on both sides of the first control gate electrode. The select transistor includes a third insulating film on the semiconductor substrate, a fourth insulating film on the third insulating film, whose basic component is an aluminum oxide containing, as a small-amount component in comparison with the basic component of aluminum and oxygen, at least one of a tetravalent cationic element, a pentavalent cationic element, and N (nitrogen), a second control gate electrode on the fourth insulating film, and a second source/drain region formed in the semiconductor substrate on both sides of the second control gate electrode.

The first insulating film is a so-called tunnel insulating film, is sandwiched between the semiconductor substrate and the charge trapping layer, and has a function of passing charges by controlling bias voltage. The second insulating film is a so-called block insulating film and has the function of preventing current between the charge trapping layer and the first control gate electrode.

In the specification, when the main component of the insulating film is described as an aluminum oxide, it means that the band structure of the insulating film, in other words, a band gap can be described well by that of the aluminum oxide with some modifications due to defects and so on. That is, additional elements have just an effect of modulating the band structure of an aluminum oxide by, for example, forming defect levels, increasing the valence band maximum, decreasing the conduction band minimum, or the like. When the additional element is a small-amount component in comparison with the basic component of aluminum and oxygen, it means that the concentration of the element (atoms) in the insulating film is low, and modulation in the band structure is limited to an extent that the band structure itself of the aluminum oxide is maintained substantially.

Figure 2:
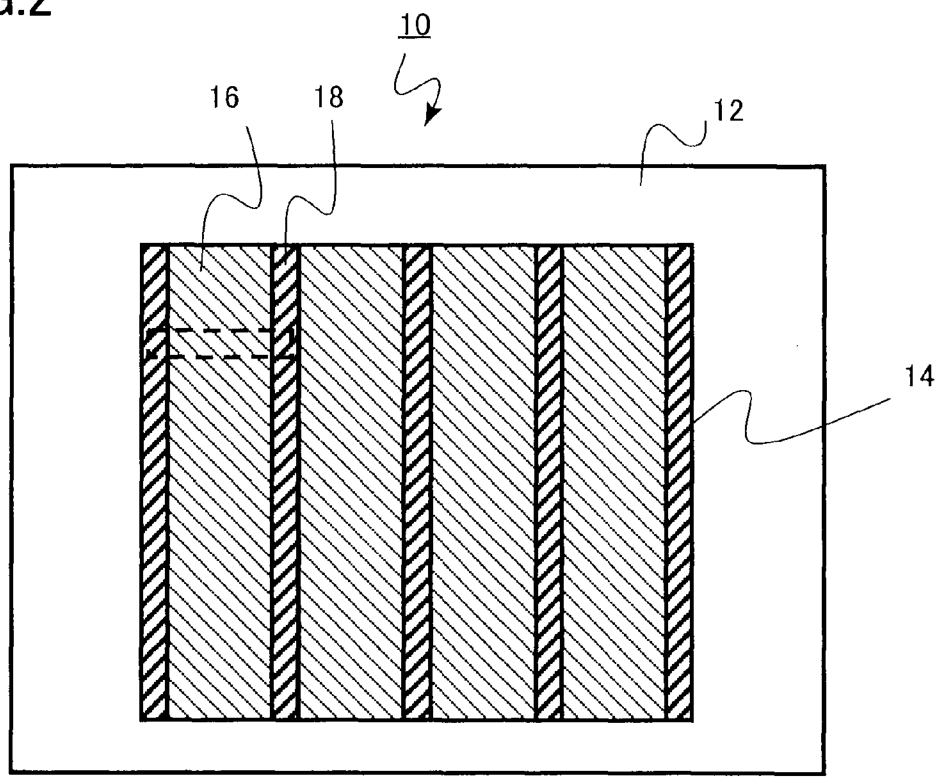
FIG. 2 is a chip layout diagram of the NAND-type nonvolatile semiconductor memory device of the first embodiment.

FIG. 2 is a chip layout diagram of a NAND-type nonvolatile memory device of the embodiment. A NAND-type nonvolatile memory device 10 has a peripheral circuit region 12 in which transistors for peripheral circuits are disposed and a core region 14 including memory cells. The core region 14 has a memory cell array region 16 in which memory cell transistors are disposed, and a select transistor region 18 which sandwiches the memory cell array region 16 and in which select transistors for selecting a desired memory cell and contacts for interconnection are disposed.

FIG. 1 is a cross section of a part of the core region 14 shown by a broken line in FIG. 2. In the NAND-type nonvolatile memory device 10, for example, “n” pieces (n: an integer) of memory cell transistors MT11 to MT1n are disposed adjacent to each other. The neighboring memory cell transistors MT11 to MT1n share the source region and the drain region, and are connected to each other in series. In the memory cell array region 16 in FIG. 2, a number of columns of memory cell transistors connected in series are aligned in parallel.

As shown in FIG. 1, the memory cell transistor has, a first insulating film 102*a* as, for example, an $SiO_2$ film on the semiconductor substrate 100 made of, for example, silicon, a charge trapping layer 104 as, for example, a silicon nitride film on the first insulating film 102*a*, a second insulating film 106*a* whose main component is an aluminum oxide on the charge trapping layer 104, a first control gate electrode 108*a* as a stack film of, for example, tantalum nitride and tungsten (TaN/W stack film) on the second insulating film 106*a*, and source/drain regions 110*a* and 110*b* formed by introducing an n-type impurity such as As or P in the semiconductor substrate 100 on both sides of the first control gate electrode 108*a*. In the embodiment, the second insulating film 106*a* contains additional element(s) as a small-amount component in comparison with the basic component of aluminum and oxygen, selected from at least one of a tetravalent cationic element, a pentavalent cationic element, and N (nitrogen).

As shown in FIG. 1, two select transistors STS1 and STD1 are disposed adjacent to both ends of the memory cell transistors MT11 to MT1n connected to each other in series. The select transistor STS1 has: a third insulating film 102*b* as an $SiO_2$ film or the like on the semiconductor substrate 100; a fourth insulating film 106*b* on the third insulating film 102*b*, whose main component is an aluminum oxide and containing, as a small-amount component in comparison with the basic component of aluminum and oxygen, at least one of a tetravalent cationic element, a pentavalent cationic element, and N (nitrogen); a second control gate electrode 108*b* as a stack film of, for example, tantalum nitride and tungsten on the fourth insulating film 106*b*; and source/drain regions 110*c* and 110*a* formed by introducing an n-type impurity such as As or P in the semiconductor substrate 100 on both sides of the second control gate electrode 108*b*.

In the embodiment, the drain region 110*a* is also used as the source region 110*a* of the neighboring memory cell transistor (MT11 in FIG. 1). However, the drain region 110*a* may not necessarily be shared. For example, in the case where one or more dummy gate pattern(s) is (are) provided between the memory cell transistor MT11 and the select transistor STS1, the source/drain region is not shared. A source line contact 22 is disposed on the source region 110*c* adjacent to the select transistor STS1.

On the other hand, the select transistor STD1 is disposed adjacent to the memory cell transistor MT1n positioned at the other end of the memory cell transistor array. The select transistor STD1 has: the third insulating film 102*b* as an $SiO_2$ film or the like on the semiconductor substrate 100; the fourth insulating film 106*b* on the third insulating film 102*b*, whose main component is an aluminum oxide and containing, as a small-amount component in comparison with the basic component of aluminum and oxygen, at least one of a tetravalent cationic element, a pentavalent cationic element, and N (nitrogen); the second control gate electrode 108*b* as a stack film of, for example, tantalum nitride and tungsten on the fourth insulating film 106*b*; and source/drain regions 110*d* and 110*e* formed by introducing an n-type impurity such as As or P in the semiconductor substrate 100 on both sides of the second control gate electrode 108*b*.

In the embodiment, the source region 110*d* is also used as the drain region 110*d* of the neighboring memory cell transistor (MT1n in FIG. 1). However, like in the select transistor STS1, the source region 110*d* may not necessarily be shared. A bit line contact 24 is disposed on the drain region 110*e* adjacent to the select transistor STD1.

According to the embodiment, the amount of charge trapping of the aluminum oxide film as a part of the gate insulating film of the select transistors STS1 and STD1 can be suppressed extremely low. Therefore, reduction of charge trapping in the gate insulating film of the select transistors STS1 and STD1 during operation of the memory can prevent the fluctuation of threshold voltage of the select transistors and, consequently, memory operation error. As a result, a NAND-type nonvolatile memory device with improved reliability can be realized.

According to the embodiment, it is unnecessary to etch off the aluminum oxide film as a part of the gate insulating film of the select transistors STS1 and STD1 for fear of fluctuations in the transistor characteristics. Therefore, spatial margin between the memory cell transistor at the end and the select transistor, conventionally provided for etching off the aluminum oxide film can be made unnecessary. Consequently, the chip area of the NAND-type nonvolatile memory device can be reduced. In addition, damage on the gate insulating film of the select transistor which occurs in the etching process of the aluminum oxide film can be also avoided.

In the embodiment, for example, the thickness of each of the first insulating film 102*a* (FIG. 1) and the third insulating film 102*b* as a silicon oxide film is about 3 nm to 5 nm. For example, the thickness of the charge trapping layer 104 as a silicon nitride film is about 1 nm to 5 nm. The thickness of the aluminum oxide film to which a tetravalent element or a pentavalent element or nitrogen (N) is added as the second insulating film 106*a* and the fourth insulating film 106*b* is about 4 nm to 15 nm.

Desirably, the tetravalent cationic element is at least one element selected from Si, Ge, Sn, Hf, Zr, and Ti, and the pentavalent cationic element is at least one element selected from V, Nb, and Ta.

In the embodiment, preferably, any one of the tetravalent cationic element, the pentavalent cationic element, and N (nitrogen) is almost uniformly contained in the aluminum oxide as the material of the forth insulating film 106*b*. With the technique, both lowering operation/stand-by power consumption by decreasing leakage current owing to the reduction of bulk defects (charge trapping centers) and suppressing the threshold voltage shift by reducing interfacial defects (charge trapping centers) around the interface between the aluminum oxide and the third insulating film can be achieved.

In the embodiment, the concentration distribution, that is the depth profile, of the additional elements may be adjusted so that the total concentration of the additional elements of the tetravalent cationic element, the pentavalent cationic element, and N (nitrogen) has a distribution whose maximum value lies on the third insulating film side. Here, the concentration of the additional elements is defined as either the number of atoms per unit volume or the relative amount of cationic elements for tetravalent or pentavalent cationic elements against Al or the relative amount of anionic elements for nitrogen against oxygen. The "lies on the third insulating film side" denotes that most of the interfacial defects distribute in a region from the lower interface with the third insulating film to the inside of the aluminum oxide film. In the case of using the aluminum oxide film in the film thickness range described above, it corresponds to the region of the range of about 10% of the film thickness.

As described above, defects as charge trapping centers in the aluminum oxide seem to be unevenly distributed around the interface between the aluminum oxide film and the third insulating film under the aluminum oxide film. On the other side, bulk defects almost uniformly exist in the aluminum oxide film. By making the additional elements distributed so that their maximum concentration lies on the third insulating film side, charge trapping defects in the entire stack structure can be reduced effectively with the minimum amount of the additional elements. In addition, by applying a technique of generating a concentration gradient, stress relaxation and reduction in the lattice mismatch can be also expected.

Preferably, the concentration of the tetravalent cationic element in a film whose main component is an aluminum oxide as the fourth insulating film is $0.03 \leqq M/(Al+M) \leqq 0.3$ (M=tetravalent cationic element), the concentration of the pentavalent cationic element in the fourth insulating film is $0.015 \leqq M/(Al+M) \leqq 0.15$ (M=pentavalent cationic element), and concentration of N (nitrogen) in the fourth insulating film is $0.02 \leqq N/(O+N) \leqq 0.4$. In the case where the concentration of additional elements resides within the ranges, the amount of the charge trapping centers can be further reduced. Here, the concentration is expressed in terms of the atomic ratio (atomic fraction, or mole fraction) of the elements in interest at a measured point.

In the embodiment, the case of using a silicon oxide film as each of the first insulating film 102*a* (FIG. 1) and the third insulating film 102*b* which act as tunnel insulating film and gate insulating film, respectively, of the memory cell transistor has been described as an example. However, in place of the silicon oxide film, a silicon oxynitride film or a stack film (ONO film) made of silicon oxide film/silicon nitride film/silicon oxide film may be used.

In the embodiment, the case of using the silicon nitride film as the charge trapping layer 104 (FIG. 1) in the memory transistor has been described as an example. The composition of the film maybe employed in either stoichiometric $Si_3N_4$ or a silicon nitride having an Si-rich composition to increase the trap density in the film. Other than the silicon nitride film, by using a high-κ film having higher dielectric constant than that of silicon nitride film, the equivalent oxide thickness (EOT) can be reduced. Consequently, an oxide film, a nitride film, or oxynitride film containing one or more element selected from Al, Hf, La, Y, Ce, Ti, Zr, and Ta can be widely used as the material of the charge trapping layer. A stacked film of those films may be also used.

In the embodiment, a stack film of tantalum nitride and tungsten as materials of the first and second control gate electrodes has been described as an example. In place of tantalum nitride, other metallic conductive materials can be widely used such as $n^+$-type polysilicon, $p^+$-type polysilicon, pure metal, silicide, borides, nitrides, carbides, or the like containing one or more elements selected from Au, Pt, Co, Be, Ni, Rh, Pd, Te, Re, Mo, Al, Hf, Ta, Mn, Zn, Zr, In, Bi, Ru, W, Ir, Er, La, Ti, and Y.

In particular, a metallic conductive material having a large work function is preferable since it can reduce leakage current from charge trapping layer to the control gate electrode through the block insulating film. In the embodiment, tungsten is used for a layer stacked on the layer of tantalum nitride. In place of tungsten, a low resistance full silicide such as nickel silicide or cobalt silicide, or a metallic conductive material can be widely used.

A method of manufacturing the NAND-type nonvolatile memory device of the embodiment will be described with reference to FIGS. 13 to 18. FIGS. 13 to 18 are cross-sectional views of the device at typical process steps showing the manufacturing method of the embodiment. A section of the memory cell transistor MT11 and the select transistor STS1 on the source contact side end in FIG. 1 in the memory cell transistor will be described as an example.

A manufacturing method of the embodiment includes the steps of: forming first and third insulating films on a semiconductor substrate; depositing a charge trapping layer on the first and third insulating films; removing the charge trapping layer on the third insulating film; forming a second insulating film made of an aluminum oxide on the charge trapping layer; forming, on the third insulating film, a fourth insulating film made of an aluminum oxide and containing at least one of a tetravalent cationic element, a pentavalent cationic element, and N (nitrogen); forming a first control gate electrode on the second insulating film; forming a second control gate electrode on the fourth insulating film; forming a first source/drain region in the semiconductor substrate on both sides of the first control gate electrode; and forming a second source/drain region in the semiconductor substrate on both sides of the second control gate electrode.

The first insulating film is an insulating film formed on the semiconductor substrate in a region where a memory cell transistor is formed, and finally acts as a tunnel insulating film in the memory cell transistor. The third insulating film denotes an insulating film formed on the semiconductor substrate in the region where the select transistor is formed, and finally acts as a gate insulating film in the select transistor. In the following, the manufacturing method of forming the first and third insulating films simultaneously will be described as an example. However, the first and third insulating films do not always have to be formed simultaneously.

Figure 13:
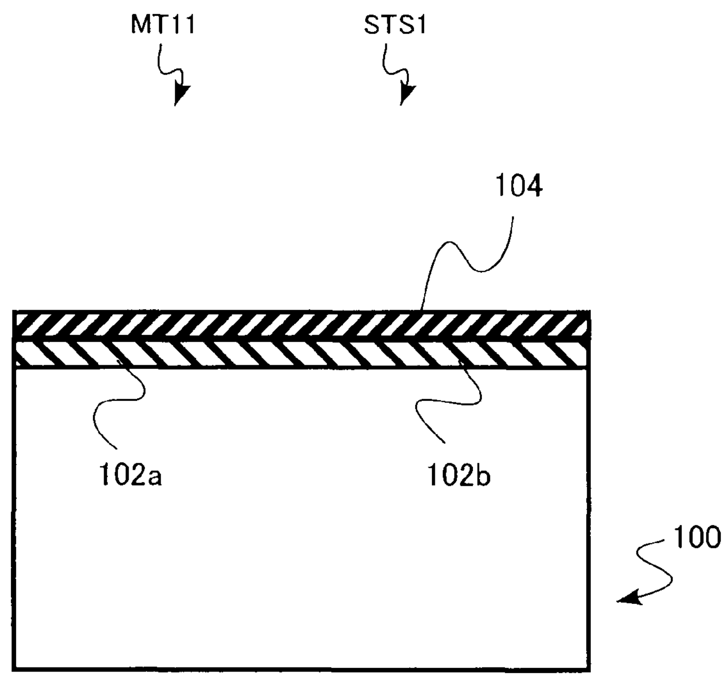
FIG. 13 to FIG. 18 are cross-sectional views of the device at typical process steps showing a method of manufacturing the NAND-type nonvolatile memory device of the first embodiment.

First, as shown in FIG. 13, on the semiconductor substrate 100 of p-type silicon having a (100) plane doped with an impurity such as B, the first and second insulating films 102*a* and 102*b* consisting of a silicon oxide film having a thickness of about 3 to 5 nm are formed by, for example, thermal oxidation. The tunnel oxide film 102*a* and the gate oxide film 102*b* may be formed by, not necessarily by thermal oxidation but by the CVD (Chemical Vapor Deposition) method or the like.

Prior to formation of the first and third insulating films 102*a* and 102*b*, a device isolation region (not shown) in which a silicon oxide film is buried by a known process is formed on the semiconductor substrate 100. Next, for example, the charge trapping layer 104 made by a silicon nitride film having a thickness of about 1 nm to 5 nm is deposited by CVD or the like on the first and third insulating films 102*a* and 102*b*.

Figure 14:
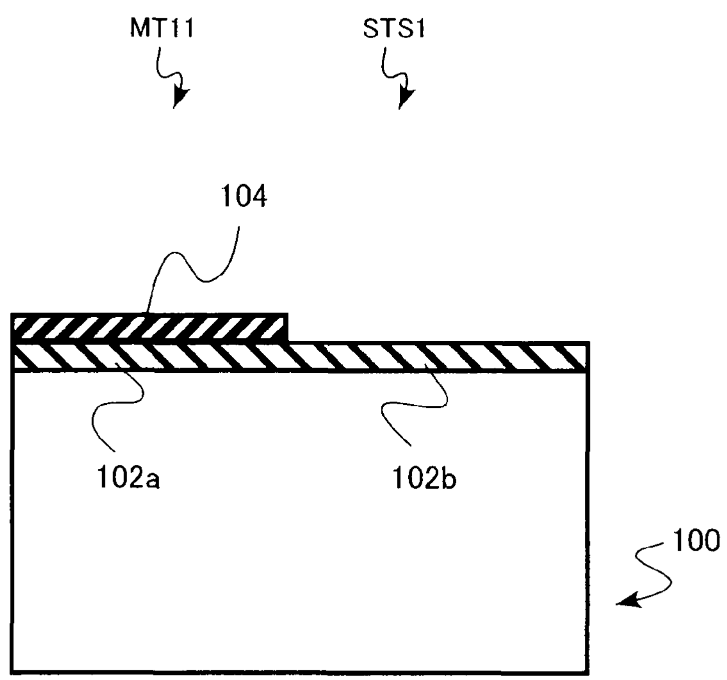

As shown in FIG. 14, the charge trapping layer 104 on the third insulating film 102*b* is removed. In detail, the charge trapping layer 104 on the insulating film in the region where the select transistor STS1 is to be formed later is selectively removed. For example, by masking the first insulating film 102*a* with a resist pattern and performing dry etching, selective removal of unmasked region can be performed.

Figure 15:
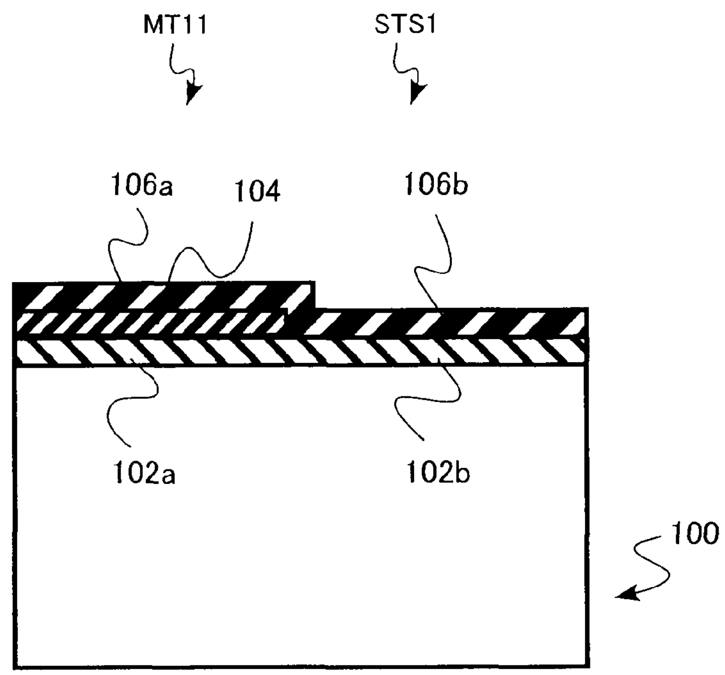

As shown in FIG. 15, on the charge trapping layer 104, the second insulating film 106*a* whose main component is an aluminum oxide is formed. On the third insulating film 102*b*, the fourth insulating film 106*b* containing, as a small-amount component in comparison with the basic component of aluminum and oxygen, at least one of a tetravalent cationic element, a pentavalent cationic element, and N (nitrogen) is formed. The case of simultaneously formation of the second and fourth insulating films 106*a* and 106*b* having the same composition is described here as an example.

The aluminum oxide film as the second and fourth insulating films 106*a* and 106*b* containing, as a small-amount component in comparison with the basic component of aluminum and oxygen, at least one of a tetravalent cationic element, a pentavalent cationic element, and N (nitrogen) is formed by sputtering using metal targets of the tetravalent or pentavalent cationic element and Al or oxide targets of the elements.

As a sputtering gas ambient, a rare gas such as Ar may be used alone. A reactive sputtering using a gas mixture in which oxygen and/or nitrogen is properly mixed at a proper flow ratio or a proper partial pressure may also be used. From the viewpoint of suppressing formation of an oxygen deficient defect (oxygen vacancy) in the aluminum oxide film 106*a* and/or 106*b*, it is preferable to use sputtering in which at least the flow rate of oxygen is precisely controlled.

The method of manufacturing the aluminum oxide film 106*a* and 106*b* is not limited to sputtering but may be thermal CVD, plasma-enhanced CVD, ALD (Atomic Layer Deposition), thermal or EB (Electron Beam) evaporation, laser ablation, MBE (Molecular Beam Epitaxy), or a method of combining some of the methods. It is also possible to deposit part or all of the full thickness of aluminum oxide film 106*a* and/or 106*b* and, after that, introduce an element of the small-amount component by ion implantation or the like.

The aluminum oxide film 106*a* and 106*b* may be also formed as follows. For example, after formation of the charge trapping layer 104, or after formation of part or all of the full thickness of aluminum oxide film 106*a* and/or 106*b*, the wafer is flowed with or immersed in a solution in which a small amount of the tetravalent or pentavalent cationic element(s) is dissolved. An adhesion amount of the additional cationic element(s) is controlled by the concentration of the element(s) in the solution, flowing time, immersion time, or the temperature of the solution. After that, the cationic element(s) can be introduced in the aluminum oxide film by subsequent heat treatment.

In the case where one of the main elements of the charge trapping layer 104 in the memory transistor region and the third insulating film 102*b* as the gate insulating film in the select transistor region is the tetravalent or pentavalent cation such as Si, the aluminum oxide film 106*a* and 106*b* may be also formed as follows. After part or all of the full thickness of aluminum oxide film 106*a* and/or 106*b* is deposited on the layers, heat treatment is performed at a temperature to set an appropriate interfacial reaction rate and inter diffusion rate and for a period. This annealing process enables to control the amount of diffusion of the tetravalent or pentavalent element(s) into the aluminum oxide film. For example, in the case where the charge trapping layer 104 consists of a silicon nitride film and the third insulating film consists of a silicon oxide film, Si can be introduced into the aluminum oxide by the above-described method.

Figure 16:
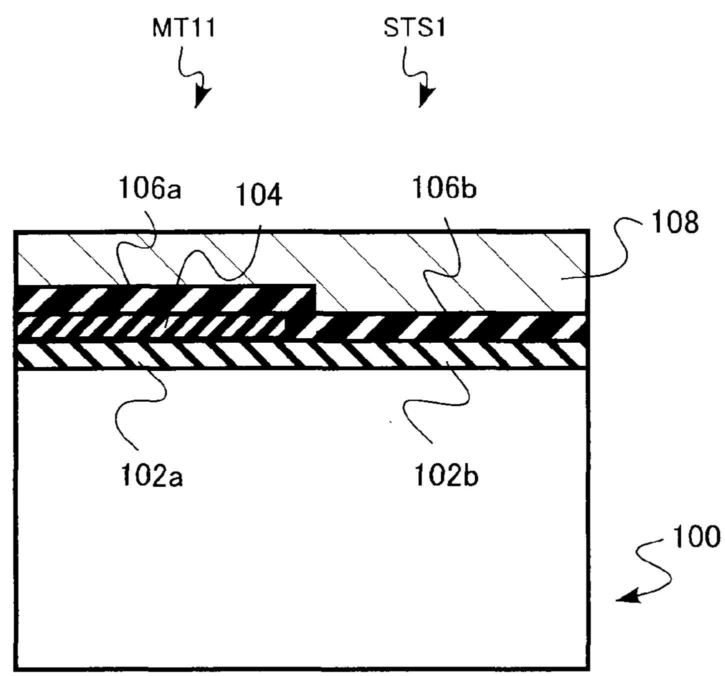

As shown in FIG. 16, a TaN/W stack film 108 is deposited on the second insulating film 106*a* and the fourth insulating film 106*b*. The TaN/W stack film 108 is obtained by forming a TaN layer by CVD using Ta $(N(CH_3)_2)_5$ or Ta $(N(CH_3)_2)_5$ and $NH_3$ as source gaseous materials, and forming a W layer by CVD using $W(CO)_6$ as a source gaseous material.

The method of manufacturing the film 108 is not limited to the above method. Other source gaseous materials may be also used. A film forming method other than the thermal CVD, such as plasma-enhanced CVD, ALD, sputtering, evaporation, laser ablation, MBE, or a method of combining any of the methods may be also employed.

Figure 17:
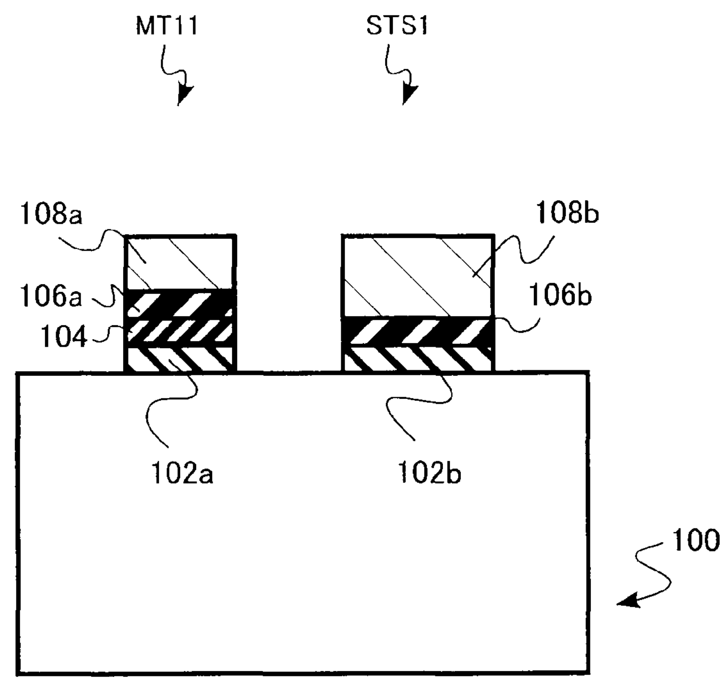

As shown in FIG. 17, by applying known lithography and RIE processes, the first control gate electrode 108*a*, the second insulating film 106*a*, the charge trapping film 104, and the first insulating film 102*a* are formed into a memory cell transistor pattern in the MT11 region. Similarly, in the select transistor STS1 region, the second control gate electrode 108*b*, the fourth insulating film 106*a*, and the third insulating film 102*b* are patterned.

Figure 18:
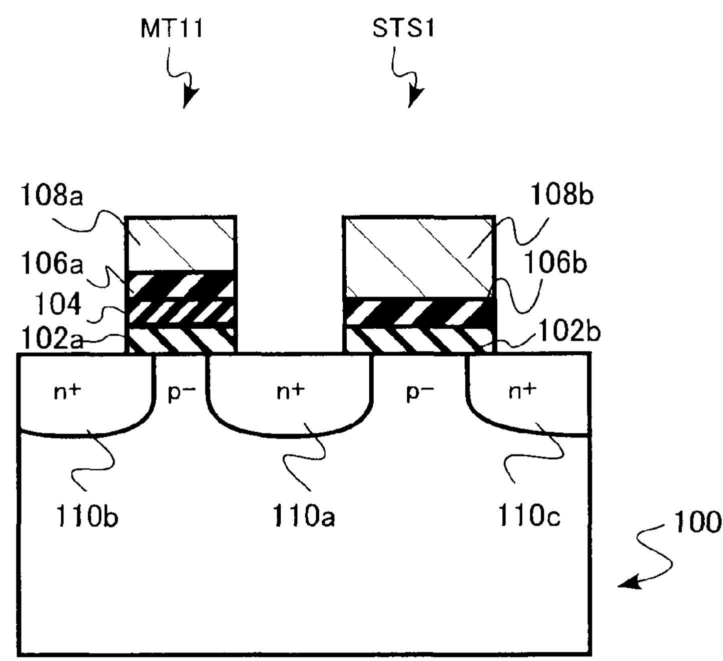

After that, as shown in FIG. 18, by arsenic (As) ion implantation, for example, using the first control gate electrode 108*a* as a mask, the $n^+$-type first source/drain regions 110*a* and 110*b* are formed in the semiconductor substrate 100 on both sides of the first control gate electrode 108*a*. By arsenic (As) ion implantation, for example, using the second control gate electrode 108*b* as a mask, the $n^+$-type second source/drain regions 110*c* and 110*a* are formed in the semiconductor substrate 100 on both sides of the second control gate electrode 108*b*.

Although the case of forming the first source/drain regions 110*a* and 110*b* and the second source/drain regions 110*c* and 110*a* by the simultaneous process step has been described as an example, the regions may be formed by different process steps. The ion implantation may be performed after deposition of a thin film on the control gate electrodes or formation of a side-wall insulating film on both sides of the control gate electrodes in order to control the position and depth of the diffusion layer. Here, the control gate electrodes mean the patterned stacks of 108*a*/106*a*/104/102*a* for MT11 region and 108*b*/106*b*/102*b* for STS11 region, for simplicity.

After that, by forming interconnects and interlayer dielectrics and the like by a known method, the NAND-type nonvolatile semiconductor memory device of the embodiment is formed.

In the embodiment, the case of applying the insulating film whose main component is an aluminum oxide and containing, as a small-amount component in comparison with the basic component of aluminum and oxygen, at least one of the tetravalent cationic element, the pentavalent cationic element, and N (nitrogen) to a part of the gate insulating film of the select transistor in the core region 14 to reduce the charge trapping centers has been described. By applying a similar gate insulating film also to peripheral circuit transistors in the peripheral circuit region 12, similar effects can be expected.

Second Embodiment

A NAND-type nonvolatile semiconductor memory device as a second embodiment of the present invention is similar to that of the first embodiment except for two points. One of the points is that the device has a fifth insulating film between the third and fourth insulating films of the select transistor. The fifth insulating film is made of an oxynitride or oxide of additional elements of at least one of a tetravalent cationic element, a pentavalent cationic element, and nitrogen and has a thickness of 0.1 to 1 nm, defined by the full width at half maximum (FWHM) of the concentration distribution of the additional elements in the memory device. The other point different from the first embodiment is that an insulating film similar to the fifth insulating film is also provided between the charge trapping layer of the memory cell transistor and the second insulating film. In the following, description similar to the first embodiment will not be repeated.

In the fifth insulating film made of an oxynitride or oxide of at least one of a tetravalent cationic element, a pentavalent cationic element, and nitrogen, after device formation is completed, aluminum is diffused into it due to interfacial reaction between the fifth insulating film and an aluminum oxide film formed on it, and an oxide film containing aluminum oxide, is formed. Here, the concentration of the additional elements is defined as either the number of atoms per unit volume or the relative amount of cationic elements for tetravalent or pentavalent cationic elements against Al or the relative amount of anionic elements for nitrogen against oxygen.

Figure 19:
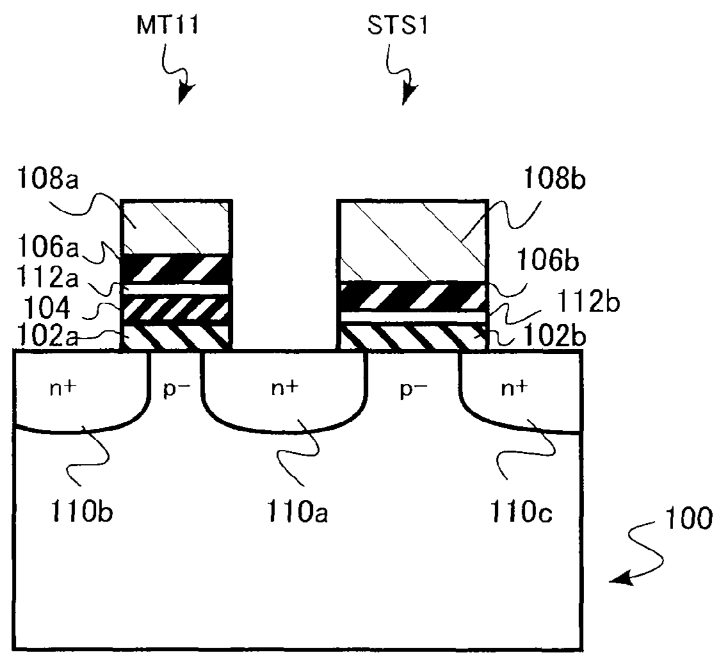
FIG. 19 is a cross-sectional view of a NAND-type nonvolatile semiconductor memory device of a second embodiment.

FIG. 19 is a cross-sectional view of a NAND-type nonvolatile semiconductor memory device of the embodiment. As shown in the figure, a fifth insulating film 112*b* made of an oxynitride or oxide of at least one of a tetravalent cationic element, a pentavalent cationic element, and nitrogen is provided between the third insulating film 102*b* in the select transistor (STS1 in the figure) and the fourth insulating film 106*b*. In the embodiment, an insulating film 112*a* similar to the fifth insulating film 112*b* is also formed between the charge trapping layer 104 and the second insulating film 106*a* in the memory cell transistor (MT11 in the figure).

In the second embodiment, the additional elements in the fifth insulating film 112*b* and the similar insulating film 112*a* made of an oxynitride or oxide of at least one of a tetravalent cationic element, a pentavalent cationic element, and nitrogen is introduced into the aluminum oxide films 106*b* and 106*a* by inter diffusion caused by heat treatment or the like. By inserting the oxide or oxynitride film containing the addition elements to the interfaces of insulating films of different kind where many interfacial defects tend to exist in nature, the additional cationic elements can be easily introduced into a portion around the both interfaces with the second 106*a* and with the fourth 106*b* insulating films those are made of an aluminum oxide as a main component. Consequently, the charge trapping defects in the entire stack structure in STS1 and MT11 can be effectively decreased, and suppression of the threshold voltage shifts can be achieved. Also by performing heat treatment on the stack structure to bring about redistribution of the additional elements so that their concentration distributions changes continuously from the interface of the insulating film of the different kind and has their concentration maximum at the interface of the insulating film of the different kind, the improvement effect is maintained.

Preferably, the thickness of the fifth insulating film 112*b* and the similar insulating film 112*a* made of an oxynitride or oxide of at least one of a tetravalent cationic element, a pentavalent cationic element, and nitrogen is in the range from 0.1 nm to 1 nm for the following reason. When the thickness is smaller than 0.1 nm, the additional elements exist in the form of dots non-uniformly in the in-plane direction at the interface of the insulating film of the different kind, and it causes variations of electrical characteristics as memory cells becoming finer. On the contrary, when the thickness exceeds 1 nm, increase in the actual film thickness and equivalent oxide thickness (EOT) becomes not to be ignored, and it disturbs shrinkage of select transistors.

In the manufacturing method of the embodiment, it is sufficient to insert a process of depositing the fifth insulating film 112*b* and the similar insulating film 112*a* made of an oxynitride or oxide of at least one of a tetravalent cationic element, a pentavalent cationic element, and nitrogen after the selective removal of the charge trapping layer 104 shown in FIG. 14 in the first embodiment. The film thickness to be deposited is, for example, 0.1 nm to 2 nm. The fifth insulating film 112*b* and the similar insulating film 112*a* can be deposited by, for example, sputtering using a metal target or oxide target of the tetravalent or pentavalent elements.

The method of manufacturing the film is not limited to the sputtering. A film forming method such as thermal or plasma-enhanced CVD, ALD, evaporation, laser ablation, MBE, or a method of combining any of the methods may be also employed. Alternatively, an insulating film having a thickness of 0.1 to 1 nm may be formed by, for example, radical nitridation of the surface of the under layer 104 and 102*b*. Since nitrogen tends to segregate in the interface having a large lattice mismatch, by performing proper heat treatment after deposition of the fifth insulating film 112*b* and/or the similar insulating film 112*a*, or after formation of a upper layer on the fifth insulating film 112*b* and/or the similar insulating film 112*a*, an insulating film having a thickness of 0.1 to 1 nm may be formed automatically at the interface. The thickness of the insulating film is defined by the full width at half maximum (FWHM) of the concentration distribution of the additional elements in the memory device.

According to the embodiment, the additional cationic elements are introduced from the fifth insulating film 112*b* and the similar insulating film 112*a* made of an oxynitride or oxide of at least one of a tetravalent cationic element, a pentavalent cationic element, and nitrogen into the insulating film of the aluminum oxide as an upper layer. Therefore, in depositing the aluminum oxide film on the fifth insulating film 112*b* and the similar insulating film 112*a*, it is not always necessary to introduce explicitly the additional elements as a small-amount component.

Third Embodiment

A NAND-type nonvolatile semiconductor memory device as a third embodiment of the present invention is similar to that of the first embodiment except for the points that the third insulating film is a silicon oxide film, and a silicon oxynitride film is provided between the third insulating film and the fourth insulating film whose main component is an aluminum oxide in the select transistor. In the following, description similar to the first embodiment will not be repeated.

Figure 20:
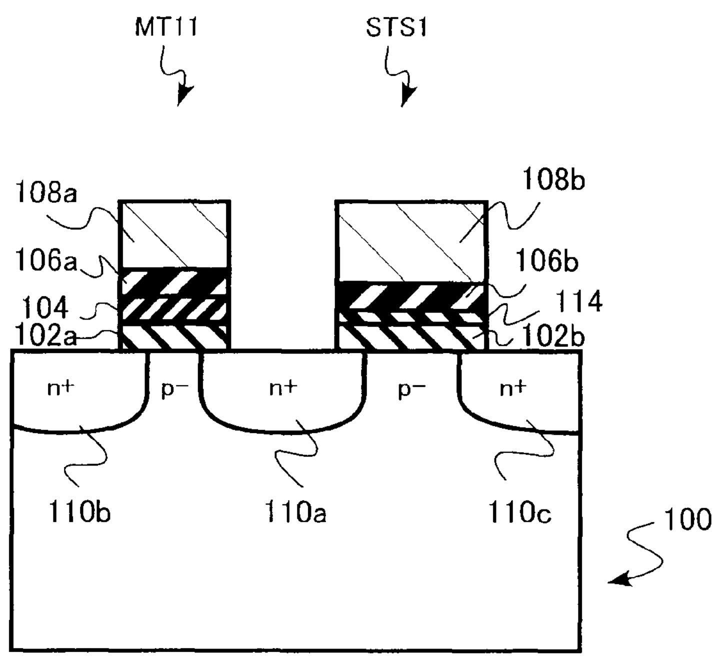
FIG. 20 is a cross-sectional view of a NAND-type nonvolatile semiconductor memory device of a third embodiment.

FIG. 20 is a cross-sectional view of a NAND-type nonvolatile semiconductor memory device of the embodiment. As shown in the figure, a silicon oxynitride film 114 is provided between the third insulating film 102*b* and the fourth insulating film 106*b* in the select transistor (STS1 in the figure).

In the third embodiment, by inserting the silicon oxynitride film 114 containing nitrogen (N) to the interface of an insulating film of different kind where many interfacial defects tend to exist in nature, nitrogen can be easily introduced into a portion around the interface with the fourth insulating film 106*b* made of an aluminum oxide as a main component. Consequently, the charge trapping defects in the entire stack structure in the select transistor can be effectively decreased, and suppression of the threshold voltage shifts can be achieved. Also by performing heat treatment on the stack structure to bring about redistribution of nitrogen so that the concentration distribution changes continuously from the interface of the insulating film of the different kind and has the concentration maximum at the interface of the insulating film of the different kind, the improvement effect is maintained.

Preferably, the thickness of the silicon oxynitride film 114 is in the range of 0.1 nm to 1 nm for the following reason. When a nitride region is thinner than 0.1 nm, N atoms tend to locally agglomerate and to form discontinuous silicon nitride islands at the interface of the insulating film of the different kind, and it causes variations of electrical characteristics as memory cells becoming finer. On the contrary, when the thickness exceeds 1 nm, increase in the actual film thickness and equivalent oxide thickness (EOT) becomes not to be ignored, and it disturbs shrinkage of the select transistor.

In the manufacturing method of the third embodiment, it is sufficient to form the silicon oxide film as the first and third insulating films in the first embodiment. And, after selective removing of the charge trapping layer 104 as shown in FIG. 14, it is sufficient to transform an upper portion of the third insulating film 102*b*, which consists of the silicon oxide film, at least in the select transistor region into the silicon oxynitride film 114 by radical nitridation.

In the embodiment, nitrogen is introduced from the silicon oxynitride film 114 into the insulating film of the aluminum oxide as an upper layer. Consequently, in depositing an aluminum oxide film on the silicon oxynitride film 114, it is not always necessary to introduce explicitly the additional elements as the small-amount component for reducing the charge trapping centers. In the third embodiment, nitrogen may be incorporated into the block insulating film in the memory transistor region and the select transistor region. In this case, if the charge trapping layer 104 in the memory transistor region is formed by the silicon nitride film, the additional process of introducing nitrogen into the block insulating film 106*a* hardly exerts an unfavorable influence on the device characteristics.

Fourth Embodiment

A NAND-type nonvolatile semiconductor memory device as a fourth embodiment of the present invention is similar to that of the second embodiment except for the following points. A silicon nitride film (SiN) layer as the charge trapping layer is not provided in the memory cell transistor region. An insulating film made of an oxynitride or oxide of at least one of a tetravalent cationic element, a pentavalent cationic element, and nitrogen is not provided between the aluminum oxide layer, which fulfills its function as the charge trapping layer in place of the silicon nitride film, and a silicon oxide film under the aluminum oxide layer. In the following, description similar to the second embodiment will not be repeated.

Figure 21:
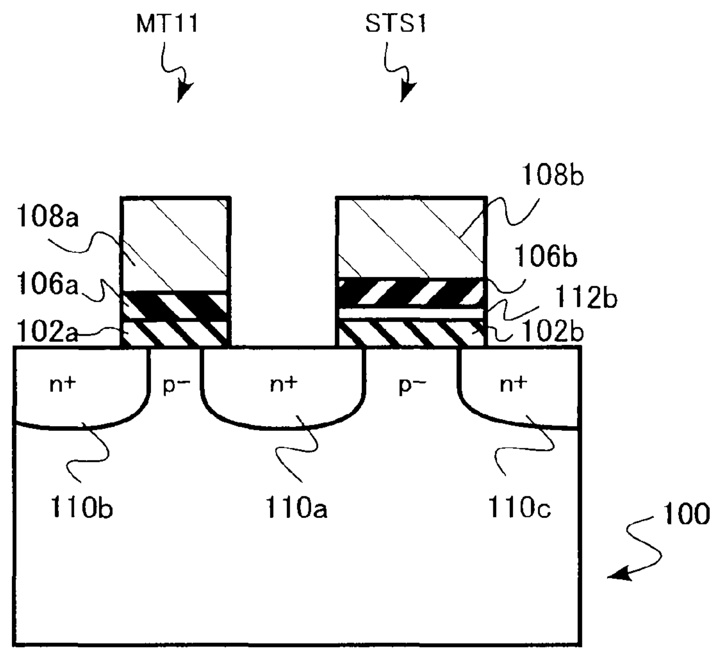
FIG. 21 is a cross-sectional view of a NAND-type nonvolatile semiconductor memory device of a fourth embodiment.

FIG. 21 is a cross-sectional view of a NAND-type nonvolatile semiconductor memory device of the embodiment. As shown in the figure, the memory cell transistor MT11 has a stack structure of the first insulating film 102*a* consisting of a silicon oxide film, the second insulating film 106*a* consisting of an aluminum oxide film, and the first control gate electrode 108*a*. Preferably, any of a tetravalent cationic element, a pentavalent cationic element, and N (nitrogen) is not contained as a small-amount component in comparison with the basic component of aluminum and oxygen in the second insulating film 106*a*.

On the other hand, the select transistor STS1 has the third insulating film 102*b* consisting of a silicon oxide film, the fifth insulating film 112*b* made of an oxynitride or oxide of additional elements of at least one of a tetravalent cationic element, a pentavalent cationic element, and nitrogen, the fourth insulating film 106*b* whose main component is an aluminum oxide, and the second control electrode 108*b*. In the fifth insulating film 112*b*, after device formation is completed, aluminum diffuses into it due to interfacial reaction between the fifth insulating film and the forth insulating film 106*b* consisting of an aluminum oxide film, and consequently an oxide film containing aluminum oxide, is formed. To the contrary, the additional cationic elements or nitrogen are introduced from the fifth insulating film 112*b* into the insulating film 106*b* of the aluminum oxide as an upper layer.

In the fourth embodiment, in a manner similar to the second embodiment, the charge trapping defects can be reduced in the select transistor STS1. Although the charge trapping layer is not explicitly formed in a memory cell transistor, as understood from the experimental results (FIGS. 3 and 4), the memory function can work sufficiently by trapping charges into interfacial traps formed around the aluminum oxide film 106*a*/silicon oxide film 102*a* interface.

The manufacturing method of the embodiment will be described mainly with respect to the point different from the first embodiment. The first 102*a* and second 102*b* insulating films are formed as silicon oxide films and, after that, an insulating film 112*b* made of an oxynitride or oxide of additional elements of at least one of a tetravalent cationic element, a pentavalent cationic element, and nitrogen is deposited. Subsequently, the insulating film is patterned so as to be remained only in the select transistor region. After that, an aluminum oxide film 106*a* and 106*b* is formed without forming the charge trapping layer. And after that, it is sufficient to form the memory cell transistor and the select transistor in a manner similar to the manufacturing method of the first embodiment.

In the insulating film made of an oxynitride or oxide of at least one of a tetravalent cationic element, a pentavalent cationic element, and nitrogen, after device formation is completed, aluminum diffuses into it due to interfacial reaction between the fifth insulating film and the forth insulating film, and consequently an oxide of aluminum is formed. Simultaneously, the additional cationic elements or nitrogen diffuse and are introduced from the lower fifth insulating film into the upper forth insulating film of the aluminum oxide. Therefore, it is not always necessary to introduce explicitly the additional element as a small-amount component in depositing the aluminum oxide film.

Fifth Embodiment

A NAND-type nonvolatile semiconductor memory device as a fifth embodiment of the present invention is similar to that of the fourth embodiment except for the point that, in place of providing an insulating film made of an oxynitride or oxide of at least one of a tetravalent cationic element, a pentavalent cationic element, and nitrogen between the silicon oxide film and an insulating film whose main component is an aluminum oxide, an aluminum oxide containing, as a small-amount component in comparison with the basic component of aluminum and oxygen, at least one of a tetravalent cationic element, a pentavalent cationic element, and nitrogen is used in the select transistor. In the following, description similar to the fourth embodiment will not be repeated.

Figure 22:
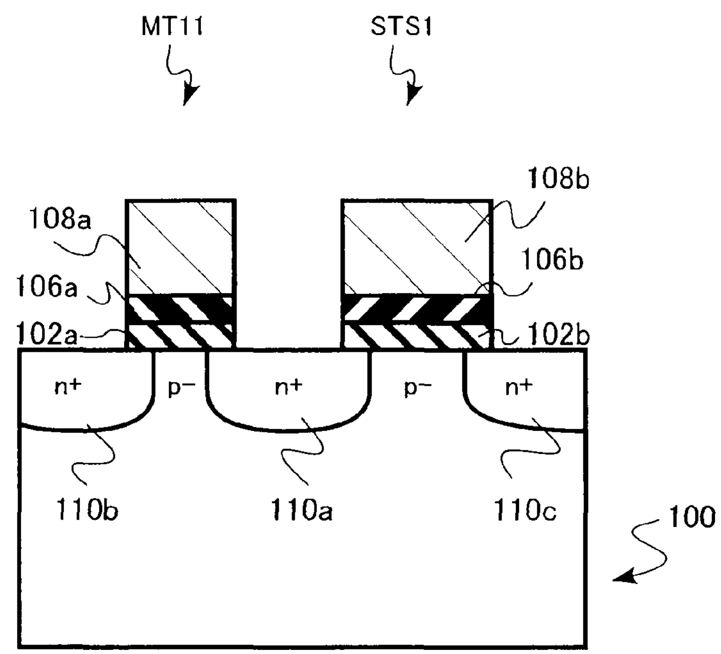
FIG. 22 is a cross-sectional view of a NAND-type nonvolatile semiconductor memory device of a fifth embodiment.

FIG. 22 is a cross-sectional view of a NAND-type nonvolatile semiconductor memory device of the embodiment. As shown in the figure, the memory cell transistor MT11 has a stack structure of the first insulating film 102*a* consisting of a silicon oxide film, the second insulating film 106*a* consisting of an aluminum oxide film, and the first control gate electrode 108*a*. Preferably, any of a tetravalent cationic element, a pentavalent cationic element, and N (nitrogen) is not contained as a small-amount component in comparison with the basic component of aluminum and oxygen in the second insulating film 106*a*.

The select transistor STS1 has a stack structure of the third insulating film 102*b* consisting of a silicon oxide film, the fourth insulating film 106*b* whose main component is an aluminum oxide and containing, as a small-amount component in comparison with the basic component of aluminum and oxygen, at least one of a tetravalent cationic element, a pentavalent cationic element, and N (nitrogen), and the second control electrode 108*b*.

In the fifth embodiment, in the select transistor STS1, in a manner similar to the first embodiment, at least one of the tetravalent cationic element and the pentavalent cationic element is almost uniformly contained in the aluminum oxide. Consequently, both lowering operation/stand-by power consumption by decreasing leakage current owing to the reduction of a bulk defects (charge trapping centers), and suppressing the threshold voltage shifts by reducing interfacial defects (charge trapping centers) around the interface between the aluminum oxide film and the third insulating film can be achieved. By adjusting the distribution of additional elements (depth profile) to be in accordance with the distributions of bulk defects and interface defects, charge trapping defects in the whole stack structure in the select transistor can be effectively reduced and suppression of the threshold voltage shifts can be achieved with the necessary but minimum amount of additional elements.

Specifically, a distribution having a concentration gradient so that each concentration of the additional elements has their maximum around the interface between the aluminum oxide film and the lower silicon oxide film in the select transistor region. By providing the concentration gradient, stress relaxation and reduction in lattice mismatch can be also expected. Although the charge trapping layer is not formed explicitly in a memory cell transistor, as disclosed in the fourth embodiment, the memory function can work sufficiently by trapping charges into interfacial traps formed around the aluminum oxide film/silicon oxide film interface.

A manufacturing method of the embodiment includes the steps of: forming first and third insulating films on a semiconductor substrate; forming a second insulating film made of an aluminum oxide on the first insulating film; forming, on the third insulating film, a fourth insulating film made of an aluminum oxide and containing at least one of a tetravalent cationic element, a pentavalent cationic element, and N (nitrogen); forming a first control gate electrode on the second insulating film; forming a second control gate electrode on the fourth insulating film; forming a first source/drain region in the semiconductor substrate on both sides of the first control gate electrode; and forming a second source/drain region in the semiconductor substrate on both sides of the second control gate electrode. The manufacturing method of the embodiment will be described mainly with respect to the point different from the first embodiment. A mask layer is deposited and patterned so that it resides only on the second insulating film 102*b* in the select transistor region. Next, the aluminum oxide film is deposited both on the memory transistor region and the select transistor region. After that, by lifting off the aluminum oxide film on the mask layer together with the mask layer in the select transistor region, the second insulating film 106*a* in the memory cell transistor region is formed.

After that, a mask layer is deposited and patterned so that it resides only on the memory transistor region, and an aluminum oxide film in which a tetravalent or pentavalent elements is contained is formed on the memory transistor region and the select transistor region by sputtering using either a metal target and/or an oxide target of the tetravalent or pentavalent element and Al.

The method of manufacturing the film is not limited to sputtering but thermal CVD, plasma-assisted CVD, ALD, evaporation, laser ablation, MBE, or a method of combining any of the methods may be also employed. It is also possible to deposit part or all of the full thickness of aluminum oxide film 106*b* and, after that, introduce an element of the small-amount component by ion implantation or the like.

After that, the aluminum oxide film on the memory transistor region is lifted off together with the mask layer. As a result, the fourth insulating film 106*b* in the select transistor region is formed. After that, by a manufacturing method similar to that of the first embodiment, the NAND-type semiconductor nonvolatile memory device is formed.

Sixth Embodiment

A NAND-type nonvolatile semiconductor memory device as a sixth embodiment of the present invention is similar to that of the first embodiment except for the following two points. One is that a second insulating film of an aluminum oxide in a memory cell transistor is a block insulating film having a three-layer stacked structure in which a silicon oxide film is sandwiched by aluminum oxide films. The other is that a fourth insulating film of an aluminum oxide in the select transistor is an insulating film having a three-layer stacked structure in which a silicon oxide film is sandwiched by aluminum oxide films. In the following, description similar to the first embodiment will not be repeated. The aluminum oxide film is an insulating film containing, as a small-amount component in comparison with the basic component of aluminum and oxygen, at least one of a tetravalent cationic element, a pentavalent cationic element, and N (nitrogen).

Figure 23:
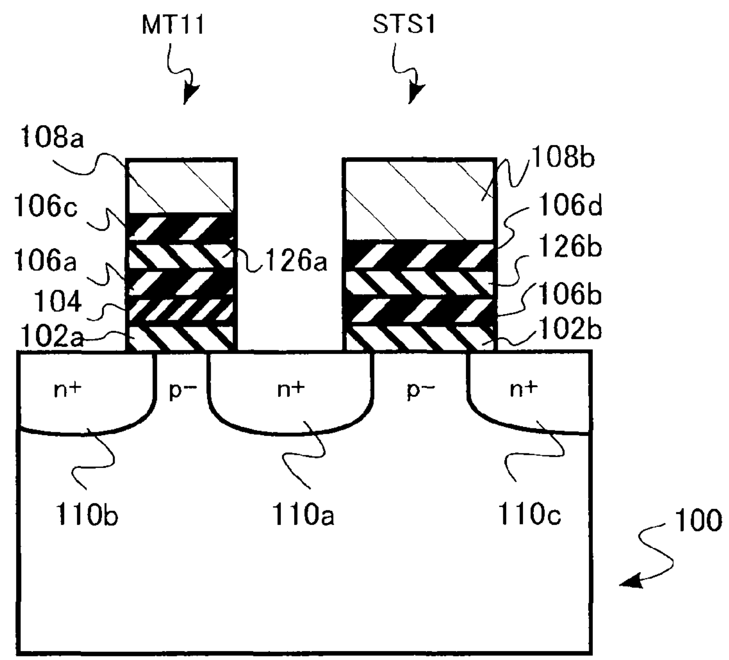
FIG. 23 is a cross-sectional view of a NAND-type nonvolatile semiconductor memory device of a sixth embodiment.

FIG. 23 is a cross-sectional view of a NAND-type nonvolatile semiconductor memory device of the sixth embodiment. As shown in the figure, the block insulating film in the memory cell transistor MT11 is a block insulating film having a three-layer stacked structure in which a silicon oxide film 126*a* is sandwiched by the second insulating film 106*a* of an aluminum oxide and a second insulating film 106*c* of the aluminum oxide. The insulating film stacked on the silicon oxide film 102*b* in the select transistor STS1 is an insulating film having a three-layer stacked structure in which a silicon oxide film 126*b* is sandwiched by the fourth insulating film 106*b* of an aluminum oxide and a fourth insulating film 106*d* made of the aluminum oxide.

In the memory cell transistor region, the thickness of the tunnel insulating film 102*a* is about 3 nm to 5 nm. The thickness of the silicon nitride film as the charge trapping layer 104 is about 1 nm to 5 nm. The thickness of the aluminum oxide film 106*a* containing, as a small-amount component in comparison with the basic component of aluminum and oxygen, at least one of a tetravalent cationic element, a pentavalent cationic element, and N (nitrogen) formed on the charge trapping layer 104 as the blocking insulating film is about 4 nm to 15 nm. The thickness of the silicon oxide film 126*a* sandwiched is about 1 nm to 5 nm. The thickness of the aluminum oxide film 106*c* containing, as a small-amount component, at least one of a tetravalent cationic element, a pentavalent cationic element, and N (nitrogen) formed on the silicon oxide film 126*a* is about 4 nm to 15 nm. Preferably, each thickness of the film 106*a* and 106*c* may be adjusted for the total thickness of the aluminum oxide film in the block insulating film having a three-layer stacked structure to be about 4 nm to 15 nm.

In the select transistor region, the thickness of the tunnel insulating film 102*b* is about 3 nm to 5 nm. The thickness of the aluminum oxide film 106*b* containing, as a small-amount component in comparison with the basic component of aluminum and oxygen, at least one of a tetravalent cationic element, a pentavalent cationic element, and N (nitrogen) as an insulating film formed on the tunnel insulating film 102_b_ is about 4 nm to 15 nm. The thickness of the silicon oxide film 126_b_ sandwiched is about 1 nm to 5 nm. The thickness of the aluminum oxide film 106_d_ containing, as a small-amount component, at least one of a tetravalent cationic element, a pentavalent cationic element, and N (nitrogen) formed on the silicon oxide film 126_b_ is about 4 nm to 15 nm. Preferably, each thickness of the film 106_b_ and 106_d_ may be adjusted for the total thickness of the aluminum oxide film in the block insulating film having a three-layer stacked structure to be about 4 nm to 15 nm.

According to the embodiment, the three-layer stacked film of the aluminum oxide film to which a desired element is added, the silicon oxide film, and the aluminum oxide film to which a desired element is added is used as the block insulating film in the memory transistor region. Consequently, both lowering operation/stand-by power consumption by decreasing leakage current owing to the reduction of bulk defects (charge trapping centers), and suppressing the threshold voltage shifts by reducing interfacial defects (charge trapping centers) around the interface between the aluminum oxide film and silicon oxide and/or silicon oxynitride films can be achieved.

By adjusting the distribution of additional elements (depth profile) to be in accordance with the distributions of bulk defects and interface defects, charge trapping defects in the whole stack structure in the select transistor can be effectively reduced with the necessary but minimum amount of additional elements. Further, by disposing a silicon oxide film having a potential energy barrier for electrons larger than that of the aluminum oxide film in the center of the stack of the block film, excellent charge retention characteristics can be assured.

The manufacturing method of the embodiment will be described mainly with respect to the point different from the first embodiment. After removal of the charge trapping layer 104 in the select transistor region, an aluminum oxide film to which a desired element is added, a silicon oxide film, and an aluminum oxide film to which a desired element is added are sequentially formed. As a method of forming the silicon oxide film, thermal oxidation or radical oxidation of polysilicon, or ALD using, as source gaseous materials, an organosilicon compound gas such as TDMAS (Trisdimethyl amino silane) and oxidant gas such as ozone may be used.

After that, a control gate electrode material is deposited like the process shown in FIG. 16 and, in a manner similar to the first embodiment, the NAND-type semiconductor nonvolatile memory device is formed.

Seventh Embodiment

A NAND-type nonvolatile semiconductor memory device as a seventh embodiment of the present invention is similar to that of the sixth embodiment except that an insulating film made of an oxynitride or oxide of at least one of a tetravalent cationic element, a pentavalent cationic element, and nitrogen exists between an aluminum oxide film and a silicon oxide film or silicon nitride film which resides on or under the aluminum oxide film, in each of a memory cell transistor and a select transistor.

With the stack structure, a film regarded as the block insulating film in the memory cell transistor has a six-layer stacked structure. From the viewpoint of ease of the process, the gate insulating film in the select transistor also has the same six-layer stacked structure which is stacked on the silicon oxide film as the inherent gate insulating film. In the following, description similar to the first and sixth embodiments will not be repeated.

Figure 24:
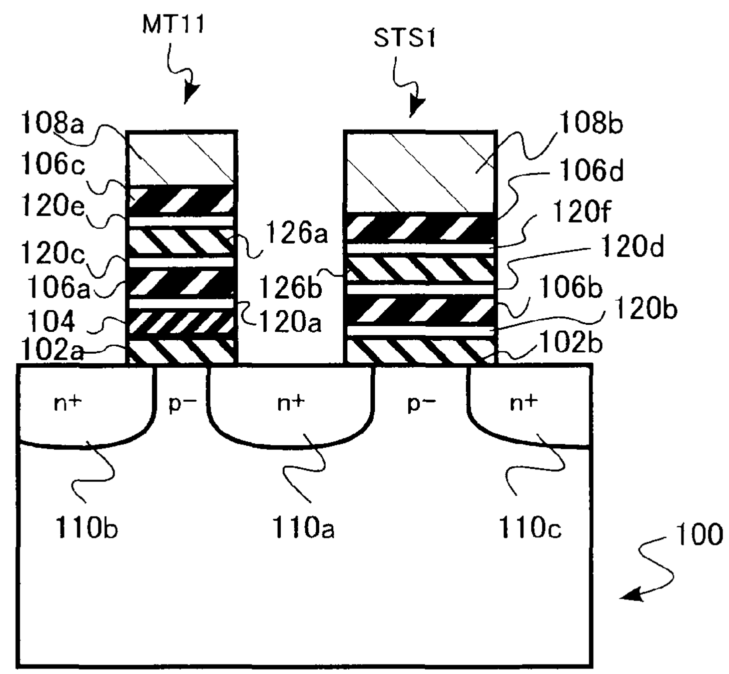
FIG. 24 is a cross-sectional view of a NAND-type nonvolatile semiconductor memory device of a seventh embodiment.

FIG. 24 is a cross-sectional view of a NAND-type nonvolatile semiconductor memory device of the seventh embodiment. As shown in the figure, in the memory cell transistor MT11, a film regarded as the block insulating film between the charge trapping layer 104 and the first control electrode 108_a_ has a six-layer stacked structure of, in order from the bottom, an insulating film 120_a_ made of an oxynitride or oxide of at least one of a tetravalent cationic element, a pentavalent cationic element, and nitrogen, the second insulating film 106_a_ of an aluminum oxide, an insulating film 120_c_ made of an oxynitride or oxide of at least one of a tetravalent cationic element and a pentavalent cationic element, the silicon oxide film 126_a_, an insulating film 102_e_ made of at least one of a tetravalent cationic element, a pentavalent cationic element, and nitrogen, and the second insulating film 106_c_ of an aluminum oxide. After device formation is completed, aluminum diffuses into the insulating films 120_a_, 120_c_, and 120_e_ due to interfacial reaction between the insulating films and the second insulating films 106_a_ and 106_c_, and an oxide of the aluminum is formed. Simultaneously, the additional cationic elements or nitrogen diffuse and are introduced from the insulating films 120_a_, 120_c_, and 120_e_ into the insulating films 106_a_ and 106_c_ of the aluminum oxide.

In the select transistor STS1, an insulating film between the tunnel oxide film 102_b_ and the first control electrode 108_b_ has a six-layer stacked structure of, in order from the bottom, the insulating film 120_b_ made of an oxynitride or oxide of at least one of a tetravalent cationic element, a pentavalent cationic element, and nitrogen, the fourth insulating film 106_b_ of an aluminum oxide, an insulating film 120_d_ made of an oxynitride or oxide of at least one of a tetravalent cationic element, a pentavalent cationic element, and nitrogen, the silicon oxide film 126_b_, an insulating film 102_f_ made of an oxynitride or oxide at least one of a tetravalent cationic element, a pentavalent cationic element, and nitrogen, and the fourth insulating film 106_d_ of an aluminum oxide. After device formation is completed, aluminum diffuses into the insulating films 120_b_, 120_d_, and 120_f_ due to interfacial reaction between the films and the fourth insulating layers 106_b_ and 106_d_, and an oxide of the aluminum is formed. Simultaneously, the additional cationic elements or nitrogen diffuse and are introduced from the insulating films 120_b_, 120_d_, and 120_f_ into the insulating films 106_b_ and 106_d_ of the aluminum oxide.

In the memory cell transistor region, the thickness of the tunnel insulating film 102_a_ is about 3 nm to 5 nm. The thickness of the silicon nitride film as the charge trapping layer 104 is about 1 nm to 5 nm. The thickness of the insulating film 120_a_ made of an oxynitride or oxide of at least one of a tetravalent cationic element, a pentavalent cationic element, and nitrogen formed on the silicon nitride film is about 0.1 nm to 1 nm. The thickness of the aluminum oxide film 106_a_ formed on the insulating film 120_a_ is about 4 nm to 15 nm. The thickness of the insulating film 120_c_ made of an oxynitride or oxide of at least one of a tetravalent cationic element and a pentavalent cationic element formed on the aluminum oxide film 106_a_ is about 0.1 nm to 1 nm. The thickness of the silicon oxide film 126_a_ formed on the insulating film 120_c_ is about 1 nm to 5 nm. The thickness of the insulating film 102_e_ made of an oxynitride or oxide of at least one of a tetravalent cationic element, a pentavalent cationic element, and nitrogen formed on the silicon oxide film is about 0.1 nm to 1 nm. The thickness of the aluminum oxide film 106_c_ formed on the insulating film 102_e_ is about 4 nm to 15 nm. Preferably, each thickness of the film 106*a* and 106*c* may be adjusted for the total thickness of the aluminum oxide film in the block insulating film having a six-layer stacked structure to be about 4 nm to 15 nm.

The six-layer stack order and the thickness of each layer in the select transistor region are the same as those in the memory cell transistor region since the films are formed in the same manufacturing processes except for the point that the silicon nitride film as the charge trapping layer does not exist on the tunnel insulating film 102*b*.

According to the embodiment, as the block insulating film in the memory transistor region after device formation is completed, the six-layer stacked film is regarded through the interfacial reactions as three-layer stacked film of the aluminum oxide film to which a desired element is added in a preferable concentration distribution, the silicon oxide film, and the aluminum oxide film to which a desired element is added in a preferable concentration distribution. Consequently, both lowering operation/stand-by power consumption by decreasing leakage current owing to the reduction of bulk defects (charge trapping centers), and suppressing the threshold voltage shifts by reducing interfacial defects (charge trapping centers) around the interface between the aluminum oxide film and silicon oxide and/or silicon oxynitride films can be achieved.

By adjusting the distribution of additional elements (depth profile) to be in accordance with the distributions of bulk defects and interface defects, charge trapping defects in the whole stack structure in the select transistor can be effectively reduced with the necessary but minimum amount of additional elements. Further, by disposing a silicon oxide film having a potential energy barrier for electrons larger than that of the aluminum oxide film in the center of the stack of the block film, excellent charge retention characteristics can be assured.

The manufacturing method of the embodiment will be described below mainly with respect to the point different from the first and sixth embodiments. After removal of the charge trapping layer 104 in the select transistor region, the sixth-layer structure is sequentially formed, which is made of an oxynitride or oxide film of at least one of a tetravalent cationic element, a pentavalent cationic element, and nitrogen, an aluminum oxide film, an oxynitride or oxide film of at least one of a tetravalent cationic element, a pentavalent cationic element, and nitrogen, a silicon oxide film, an oxynitride or oxide film of at least one of a tetravalent cationic element, a pentavalent cationic element, and nitrogen, and an aluminum oxide film.

After that, a control gate electrode material is deposited like the process shown in FIG. 16 and, in a manner similar to the first embodiment, the NAND-type semiconductor nonvolatile memory device is formed.

Eighth Embodiment

A NAND-type nonvolatile semiconductor memory device as an eighth embodiment of the present invention is similar to that of the first embodiment except that an insulating film whose main component is an aluminum oxide and containing, as a small-amount component in comparison with the basic component of aluminum and oxygen, at least one of a tetravalent cationic element, a pentavalent cationic element, and N (nitrogen) and a silicon oxide film on the insulating film exist between the first insulating film (tunnel insulating film) and the charge trapping layer in a memory cell transistor. In the following, description similar to the first embodiment will not be repeated.

The eighth embodiment relates to a structure in which a silicon nitride film (or silicon oxynitride film) in a silicon oxide film/silicon nitride film (or silicon oxynitride film)/silicon oxide film structure, so-called ONO structure, which is known as a tunnel insulating film is replaced with an insulating film whose main component is an aluminum oxide and containing, as a small-amount component in comparison with the basic component of aluminum and oxygen, at least one of a tetravalent cationic element, a pentavalent cationic element, and N (nitrogen). That is, the object of the eighth embodiment is to improve the tunnel insulating film and is different from improvement of the block film or the charge trapping layer described in the first to seventh embodiments. Therefore, the eighth embodiment can be applied to all of the tunnel insulating film in the memory cell transistor and the gate insulating film in the select transistor in the first to seventh embodiments.

Figure 25:
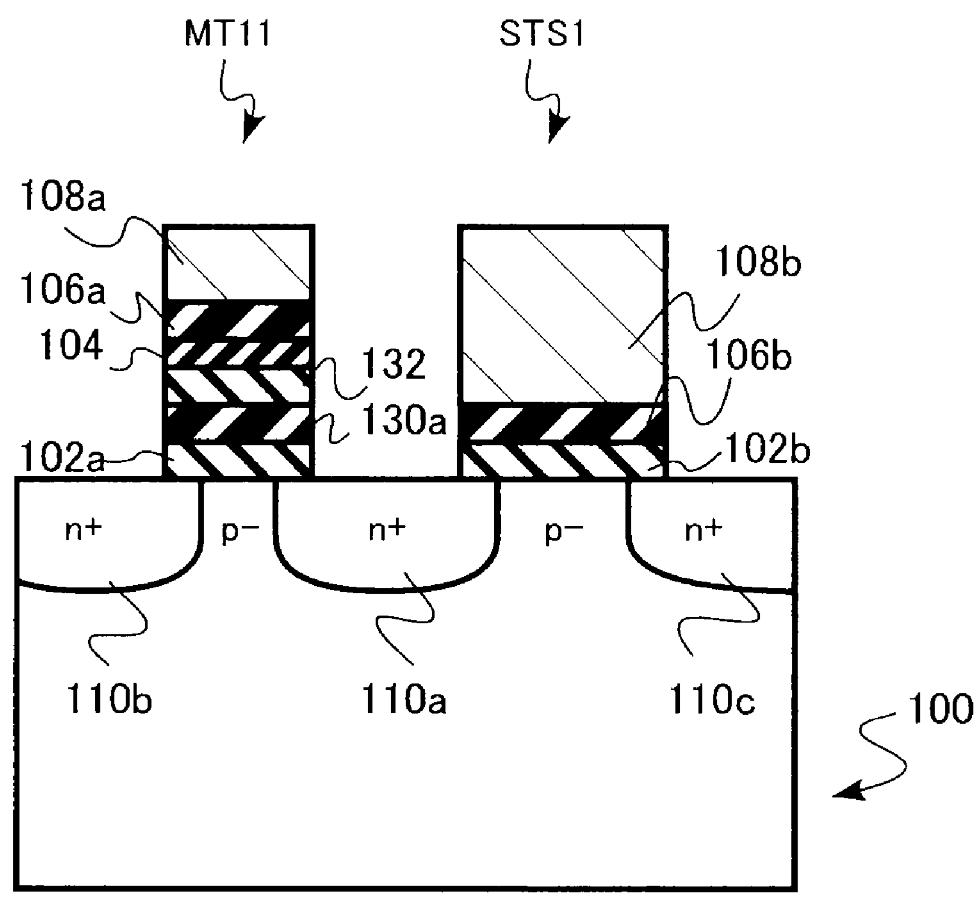
FIG. 25 is a cross-sectional view of a NAND-type nonvolatile semiconductor memory device of an eighth embodiment.

FIG. 25 is a cross-sectional view of a NAND-type nonvolatile semiconductor memory device of the eighth embodiment. As shown in the figure, in the memory cell transistor MT11, an insulating film 130*a* whose main component is an aluminum oxide and containing, as a small-amount component in comparison with the basic component of aluminum and oxygen, at least one of a tetravalent cationic element, a pentavalent cationic element, and N (nitrogen), and a silicon oxide film 132 on the insulating film 130*a* exist between the first insulating film 102*a* and the charge trapping layer 104. That is, the tunnel insulating film has a three-layer stacked structure of the first insulating film 102*a*, the aluminum oxide film 130*a* to which a desired element is added with a preferable concentration distribution, and the silicon oxide film 132.

The gate insulating film in the select transistor STS1 has a two-layer stacked structure of the first insulating film 102*b* and an insulating film 130*b* formed on the first insulating film 102*b*, whose main component is an aluminum oxide, and containing, as a small-amount component in comparison with the basic component of aluminum and oxygen, at least one of a tetravalent cationic element, a pentavalent cationic element, and N (nitrogen).

In the memory transistor region, the thickness of the silicon oxide on the silicon substrate as the tunnel insulating film 102*a* is about 1 nm to 4 nm. The thickness of the aluminum oxide film 130*a* which is on the silicon oxide film and to which the tetravalent or pentavalent element or nitrogen is added is about 1 nm to 5 nm. The thickness of the silicon oxide film 132 formed on the aluminum oxide film 130*a* is about 1 nm to 4 nm. The thickness of the silicon nitride film as the charge trapping layer 104 is about 1 nm to 5 nm. The thickness of the aluminum oxide film 106*a* as the block insulating film to which a tetravalent or pentavalent element or nitrogen is added is about 4 nm to 15 nm.

In the select transistor region, the thickness of the gate insulating film 102*b* is about 3 nm to 5 nm, and the thickness of the aluminum oxide film 106*a* as a block insulating film to which a tetravalent or pentavalent element or nitrogen is added is about 4 nm to 15 nm.

According to the embodiment, as the tunnel insulating film in the memory transistor region, a stacked film of a silicon oxide film, the aluminum oxide film to which a desired element is added in a preferable concentration distribution, and a silicon oxide film is used. Consequently, both lowering operation/stand-by power consumption by decreasing leakage current owing to the reduction of bulk defects (charge trapping centers), and suppressing the threshold voltage shifts by reducing interfacial defects (charge trapping centers) around the interface between the aluminum oxide film and silicon oxide and/or silicon oxynitride films can be achieved.

By adjusting the distribution of additional elements (depth profile) to be in accordance with the distributions of bulk defects and interface defects, charge trapping defects in the whole stack structure in the tunnel insulating film in the memory transistor can be effectively reduced with the necessary but minimum amount of additional elements. Specifically, a distribution having a concentration gradient so that each concentration of the additional elements has their maximum around the interface between the aluminum oxide film and the lower and upper silicon oxide films. y providing the concentration gradient, stress relaxation and reduction in the lattice mismatch can be also expected. Further, by disposing the aluminum oxide film having a potential energy barrier for electrons smaller than that of the silicon oxide film in the center of the stack of the tunnel insulating film, excellent write/erase characteristics of a tunnel film can be assured.

The embodiments of the present invention have been described with reference to the concrete examples. The embodiments are described just as examples and do not limit the present invention. In the embodiments, parts and the like in the NAND-type nonvolatile semiconductor memory devices and the methods of manufacturing the same, which are not directly necessary for the description of the present invention have not been described. However, necessary elements related to the NAND-type nonvolatile semiconductor memory devices and the methods of manufacturing the same can be properly selected and used.

As the material of the semiconductor substrate, a silicon (Si) has been described as an example. However, the material is not always limited to silicon (Si) but silicon germanium (SiGe), germanium (Ge), silicon carbide (SiC), gallium arsenide (GaAs), aluminum nitride (AlN), gallium nitride (GaN), indium antimonide (InSb), or the like. A strained substrate of any of the materials, to which or of which a strain is introduced partially to or the whole can be also employed.

The plane direction of the substrate material is not always limited to the (100) plane but may be the (110) plane, the (111) plane, or the like.

All of NAND-type nonvolatile semiconductor memory devices each having the elements of the present invention and which can be modified by a person skilled in the art are in the scope of the present invention. The scope of the present invention is defined by the scope of the claims and the scope of equivalence of the claims.

What is claimed is:

1. A NAND-type nonvolatile semiconductor memory device comprising, a semiconductor substrate, a plurality of memory cell transistors connected to each other in series formed on the semiconductor substrate, and a select transistor provided at each end of the plurality of memory cell transistors formed on the semiconductor substrate, wherein the memory cell transistor comprises:

a first insulating film on the semiconductor substrate;

a charge trapping layer on the first insulating film;

a second insulating film made of aluminum oxide on the charge trapping layer;

a first control gate electrode on the second insulating film; and a first source/drain region formed in the semiconductor substrate on both sides of the first control gate electrode, and the select transistor comprises:

a third insulating film on the semiconductor substrate;

a fourth insulating film on the third insulating film made of an aluminum oxide containing at least one of a tetravalent cationic element, a pentavalent cationic element, and N (nitrogen);

a second control gate electrode on the fourth insulating film; and a second source/drain region formed in the semiconductor substrate on both sides of the second control gate electrode.

2. The device according to claim 1, wherein total concentration of the tetravalent cationic element, the pentavalent cationic element, and N (nitrogen) in the fourth insulating film has a distribution (depth profile) whose maximum value lies on the third insulating film side.

3. The device according to claim 2, wherein concentration in the fourth insulating film of the tetravalent cationic element is $0.03 \leqq M/(Al+M) \leqq 0.3$ (M represents tetravalent cationic element and stands for its number density, and Al stands for a number density of Al atom), concentration in the fourth insulating film of the pentavalent cationic element is $0.015 \leqq M/(Al+M) \leqq 0.15$ (M represents pentavalent cationic element and stands for its number density), and concentration in the fourth insulating film of N (nitrogen) is $0.02 \leqq N/(O+N) \leqq 0.4$ where N and O stand for number densities of N atom and O atom, respectively.

4. The device according to claim 2, wherein the tetravalent cationic element is at least one element selected from Si, Ge, Sn, Hf, Zr, and Ti, and the pentavalent cationic element is at least one element selected from V, Nb, and Ta.

5. The device according to claim 1, wherein at least one of the tetravalent cationic element, the pentavalent cationic element, and N (nitrogen) is contained almost uniformly in the fourth insulating film.

6. The device according to claim 5, wherein concentration in the fourth insulating film of the tetravalent cationic element is $0.03 \leqq M/(Al+M) \leqq 0.3$ (M represents tetravalent cationic element and stands for its number density, and Al stands for a number density of Al atom), concentration in the fourth insulating film of the pentavalent cationic element is $0.015 \leqq M/(Al+M) \leqq 0.15$ (M represents pentavalent cationic element and stands for its number density), and concentration in the fourth insulating film of N (nitrogen) is $0.02 \leqq N/(O+N) \leqq 0.4$ where N and O stand for number densities of N atom and O atom, respectively.

7. The device according to claim 5, wherein the tetravalent cationic element is at least one element selected from Si, Ge, Sn, Hf, Zr, and Ti, and the pentavalent cationic element is at least one element selected from V, Nb, and Ta.

8. The device according to claim 1, further comprising a fifth insulating film between the third and fourth insulating films, the fifth insulating film being made of an aluminum oxide containing at least one of the tetravalent cationic element, the pentavalent cationic element, and nitrogen, and having a film thickness of 0.1 nm to 1 nm, the film thickness being defined by the full width at half maximum (FWHM) of the concentration distribution of the contained element.

9. The device according to claim 8, wherein concentration in the fourth insulating film of the tetravalent cationic element is $0.03 \leqq M/(Al+M) \leqq 0.3$ (M represents tetravalent cationic element and stands for its number density, and Al stands for a number density of Al atom), concentration in the fourth insulating film of the pentavalent cationic element is $0.015 \leqq M/(Al+M) \leqq 0.15$ (M represents pentavalent cationic element and stands for its number density), and concentration in the fourth insulating film of N (nitrogen) is $0.02 \leqq N/(O+N) \leqq 0.4$ where N and O stand for number densities of N atom and O atom, respectively.

10. The device according to claim 8, wherein the tetravalent cationic element is at least one element selected from Si, Ge, Sn, Hf, Zr, and Ti, and the pentavalent cationic element is at least one element selected from V, Nb, and Ta.

11. The device according to claim 1, wherein concentration in the fourth insulating film of the tetravalent cationic element is $0.03 \leqq M/(Al+M) \leqq 0.3$ (M represents tetravalent cationic element and stands for its number density, and Al stands for a number density of Al atom), concentration in the fourth insulating film of the pentavalent cationic element is $0.015 \leqq M/(Al+M) \leqq 0.15$ (M represents pentavalent cationic element and stands for its number density), and concentration in the fourth insulating film of N (nitrogen) is $0.02 \leqq N/(O+N) \leqq 0.4$ where N and O stand for number densities of N atom and O atom, respectively.

12. The device according to claim 1, wherein the tetravalent cationic element is at least one element selected from Si, Ge, Sn, Hf, Zr, and Ti, and the pentavalent cationic element is at least one element selected from V, Nb, and Ta.

13. A NAND-type nonvolatile semiconductor memory device comprising, a semiconductor substrate, a plurality of memory cell transistors connected to each other in series formed on the semiconductor substrate, and a select transistor provided at each end of the plurality of memory cell transistors formed on the semiconductor substrate, wherein the memory cell transistor comprises:

a first insulating film on the semiconductor substrate;

a second insulating film made of aluminum oxide on the first insulating film;

a first control gate electrode on the second insulating film; and a first source/drain region formed in the semiconductor substrate on both sides of the first control gate electrode, and the select transistor comprises:

a third insulating film on the semiconductor substrate;

a fourth insulating film on the third insulating film, the fourth insulating film being made of an aluminum oxide containing at least one of a tetravalent cationic element, a pentavalent cationic element, and N (nitrogen);

a second control gate electrode on the fourth insulating film, and a second source/drain region formed in the semiconductor substrate on both sides of the second control gate electrode.

14. The device according to claim 13, wherein total concentration of the tetravalent cationic element, the pentavalent cationic element, and N (nitrogen) in the fourth insulating film has a distribution (depth profile) whose maximum value lies on the third insulating film side.

15. The device according to claim 14, wherein concentration in the fourth insulating film of the tetravalent cationic element is $0.03 \leqq M/(Al+M) \leqq 0.3$ (M represents tetravalent cationic element and stands for its number density, and Al stands for a number density of Al atom), concentration in the fourth insulating film of the pentavalent cationic element is $0.015 \leqq M/(Al+M) \leqq 0.15$ (M represents pentavalent cationic element and stands for its number density), and concentration in the fourth insulating film of N (nitrogen) is $0.02 \leqq N/(O+N) \leqq 0.4$ where N and O stand for number densities of N atom and O atom, respectively.

16. The device according to claim 14, wherein the tetravalent cationic element is at least one element selected from Si, Ge, Sn, Hf, Zr, and Ti, and the pentavalent cationic element is at least one element selected from V, Nb, and Ta.

17. The device according to claim 13, wherein at least one of the tetravalent cationic element, the pentavalent cationic element, and N (nitrogen) is contained almost uniformly in the fourth insulating film.

18. The device according to claim 17, wherein concentration in the fourth insulating film of the tetravalent cationic element is $0.03 \leqq M/(Al+M) \leqq 0.3$ (M represents tetravalent cationic element and stands for its number density, and Al stands for a number density of Al atom), concentration in the fourth insulating film of the pentavalent cationic element is $0.015 \leqq M/(Al+M) \leqq 0.15$ (M represents pentavalent cationic element and stands for its number density), and concentration in the fourth insulating film of N (nitrogen) is $0.02 \leqq N/(O+N) \leqq 0.4$ where N and O stand for number densities of N atom and O atom, respectively.

19. The device according to claim 17, wherein the tetravalent cationic element is at least one element selected from Si, Ge, Sn, Hf, Zr, and Ti, and the pentavalent cationic element is at least one element selected from V, Nb, and Ta.

20. The device according to claim 13, further comprising a fifth insulating film between the third and fourth insulating films, the fifth insulating film being made of an aluminum oxide containing at least one of the tetravalent cationic element, the pentavalent cationic element, and nitrogen, and having a film thickness of 0.1 nm to 1 nm, the film thickness being defined by the full width at half maximum (FWHM) of the concentration distribution of the contained element.

21. The device according to claim 20, wherein concentration in the fourth insulating film of the tetravalent cationic element is $0.03 \leqq M/(Al+M) \leqq 0.3$ (M represents tetravalent cationic element and stands for its number density, and Al stands for a number density of Al atom), concentration in the fourth insulating film of the pentavalent cationic element is $0.015 \leqq M/(Al+M) \leqq 0.15$ (M represents pentavalent cationic element and stands for its number density), and concentration in the fourth insulating film of N (nitrogen) is $0.02 \leqq N/(O+N) \leqq 0.4$ where N and O stand for number densities of N atom and O atom, respectively.

22. The device according to claim 20, wherein the tetravalent cationic element is at least one element selected from Si, Ge, Sn, Hf, Zr, and Ti, and the pentavalent cationic element is at least one element selected from V, Nb, and Ta.

23. The device according to claim 13, wherein concentration in the fourth insulating film of the tetravalent cationic element is $0.03 \leqq M/(Al+M) \leqq 0.3$ (M represents tetravalent cationic element and stands for its number density, and Al stands for a number density of Al atom), concentration in the fourth insulating film of the pentavalent cationic element is $0.015 \leqq M/(Al+M) \leqq 0.15$ (M represents pentavalent cationic element and stands for its number density), and concentration in the fourth insulating film of N (nitrogen) is $0.02 \leqq N/(O+N) \leqq 0.4$ where N and O stand for number densities of N atom and O atom, respectively.

24. The device according to claim 13, wherein the tetravalent cationic element is at least one element selected from Si, Ge, Sn, Hf, Zr, and Ti, and the pentavalent cationic element is at least one element selected from V, Nb, and Ta.

* * * * *